United States Patent
Sugimoto et al.

(10) Patent No.: US 10,251,263 B2
(45) Date of Patent: Apr. 2, 2019

(54) WIRED CIRCUIT BOARD AND PRODUCING METHOD THEREOF

(71) Applicant: NITTO DENKO CORPORATION, Osaka (JP)

(72) Inventors: Yuu Sugimoto, Osaka (JP); Yoshito Fujimura, Osaka (JP); Hiroyuki Tanabe, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/712,613

(22) Filed: Sep. 22, 2017

(65) Prior Publication Data
US 2018/0014401 A1 Jan. 11, 2018

Related U.S. Application Data

(62) Division of application No. 15/463,538, filed on Mar. 20, 2017.

(30) Foreign Application Priority Data

Mar. 30, 2016 (JP) .................. 2016-069039

(51) Int. Cl.
  *H05K 1/02* (2006.01)
  *H05K 1/05* (2006.01)
  (Continued)

(52) U.S. Cl.
  CPC ......... *H05K 1/0284* (2013.01); *H05K 1/0274* (2013.01); *H05K 1/05* (2013.01);
  (Continued)

(58) Field of Classification Search
  CPC .............................. H05K 1/05; H05K 1/0284
  (Continued)

(56) References Cited

U.S. PATENT DOCUMENTS 6,252,176 B1 6/2001 Kuramochi et al.
7,250,575 B2 7/2007 Nagao et al.
(Continued)

FOREIGN PATENT DOCUMENTS

JP  H10-3632 A    1/1998
JP  2009-129490 A 6/2009
(Continued)

OTHER PUBLICATIONS

Non-Final Office Action dated Dec. 27, 2017 in U.S. Appl. No. 15/463,538.
(Continued)

*Primary Examiner* — Sherman Ng
(74) *Attorney, Agent, or Firm* — Edwards Neils, LLC; Jean C. Edwards, Esq.

(57) ABSTRACT

A method of producing a wired circuit board including an insulating layer and a conductive pattern, including: (1), an insulating layer having an inclination face, (2), a metal thin film provided at least on the inclination face, (3), a photoresist provided on the surface of the metal thin film, (4), a light shield portion of a photomask disposed so that a first portion, where the conductive pattern is to be provided in the photoresist, is shielded from light, and the photoresist is exposed to light through the photomask, (5), the first portion of the photoresist is removed to expose the metal thin film corresponding to the first portion, and (6), the conductive pattern is provided on the surface of the metal thin film exposed from the photoresist.

5 Claims, 29 Drawing Sheets

(51) Int. Cl.
- *H05K 3/06* (2006.01)
- *H05K 3/46* (2006.01)
- *H05K 3/00* (2006.01)
- *H05K 3/10* (2006.01)

(52) U.S. Cl.
CPC ........... *H05K 3/064* (2013.01); *H05K 3/4644* (2013.01); *H05K 3/4679* (2013.01); *H05K 3/0008* (2013.01); *H05K 3/06* (2013.01); *H05K 3/108* (2013.01); *H05K 2201/09227* (2013.01); *H05K 2201/09272* (2013.01); *H05K 2203/056* (2013.01); *H05K 2203/0557* (2013.01); *H05K 2203/0562* (2013.01)

(58) Field of Classification Search
USPC ........................................................ 174/250
See application file for complete search history.

(56) References Cited

U.S. PATENT DOCUMENTS

| | | | | |
|---|---|---|---|---|
| 8,003,893 | B2* | 8/2011 | Miura | H01L 21/4807 |
| | | | | 174/251 |
| 8,610,000 | B2* | 12/2013 | Champion | H05K 1/0245 |
| | | | | 174/262 |
| 8,664,535 | B2* | 3/2014 | Kamei | H05K 1/0248 |
| | | | | 174/250 |
| 9,226,395 | B2 | 12/2015 | Ihara | |
| 10,143,088 | B2 | 11/2018 | Sugimoto et al. | |
| 2005/0087364 | A1* | 4/2005 | Umemoto | H01L 23/49816 |
| | | | | 174/260 |
| 2006/0268530 | A1* | 11/2006 | Nagao | H05K 1/028 |
| | | | | 361/749 |
| 2009/0114426 | A1* | 5/2009 | Tsunekawa | G01N 21/95684 |
| | | | | 174/250 |
| 2009/0151994 | A1 | 6/2009 | Ohsawa et al. | |
| 2009/0211787 | A1 | 8/2009 | Kamei et al. | |
| 2013/0323924 | A1 | 12/2013 | DeVilliers et al. | |
| 2014/0177106 | A1 | 6/2014 | Shirafuji | |
| 2015/0034369 | A1 | 2/2015 | Kashima et al. | |
| 2015/0084208 | A1 | 3/2015 | Iida et al. | |

FOREIGN PATENT DOCUMENTS

| | | |
|---|---|---|
| JP | 2009-206281 A | 9/2009 |
| JP | 2012-089204 A | 5/2012 |
| JP | 2012-104210 A | 5/2012 |
| JP | 2012-128926 A | 7/2012 |
| JP | 2012-155802 A | 8/2012 |
| JP | 2014-127216 A | 7/2014 |

OTHER PUBLICATIONS

Non-Final Office Action issued by the USPTO dated Mar. 27, 2018 in connection with U.S. Appl. No. 15/478,711.

Final Office Action issued by the USPTO dated Apr. 30, 2018 in connection with U.S. Appl. No. 15/386,744.

Non-Final Office Action issued by the USPTO dated Dec. 27, 2017 in connection with U.S. Appl. No. 15/463,538.

Non-Final Office Action issued by the USPTO dated Dec. 28, 2017 in connection with U.S. Appl. No. 15/386,744.

Final Office Action issued by the USPTO dated Jul. 23, 2018 in connection with U.S. Appl. No. 15/463,538.

Final Office Action issued by the USPTO dated Sep. 26, 2018 in connection with U.S. Appl. No. 15/478,711.

Non-Final Office Action dated Dec. 31, 2018 in connection with U.S. Appl. No. 15/605,259.

Non-Final Office Action dated Feb. 8, 2019 in connection with U.S. Appl. No. 15/478,711.

\* cited by examiner

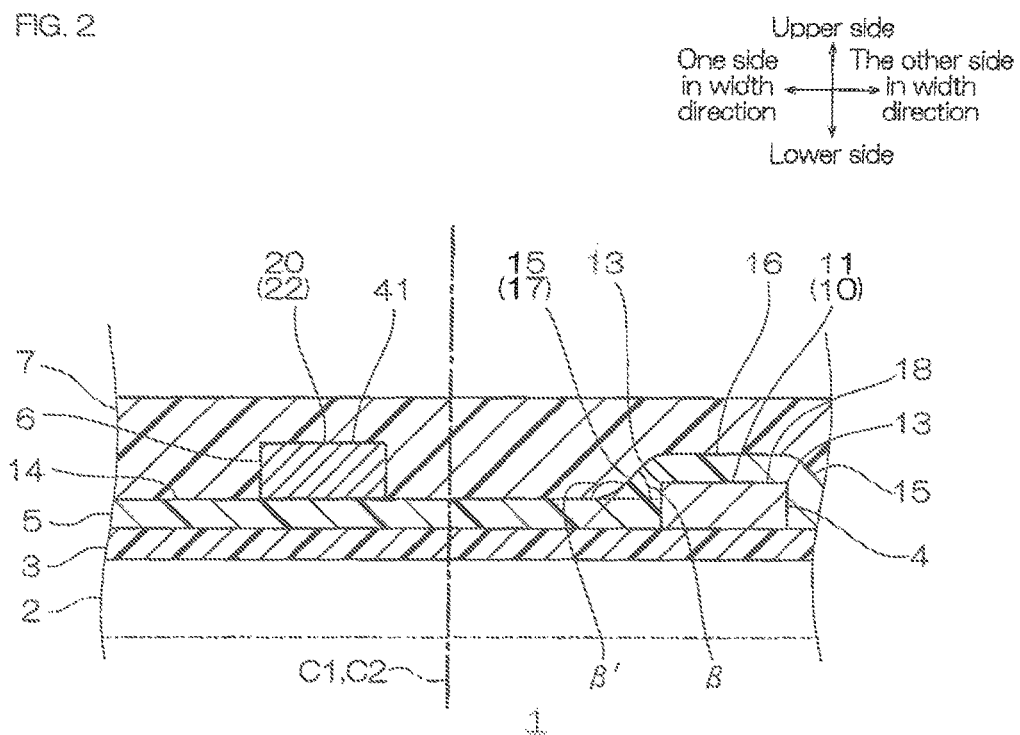

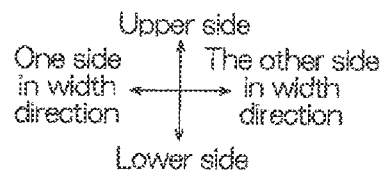
FIG. 3A
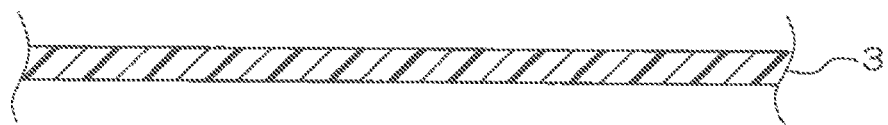
FIG. 3B
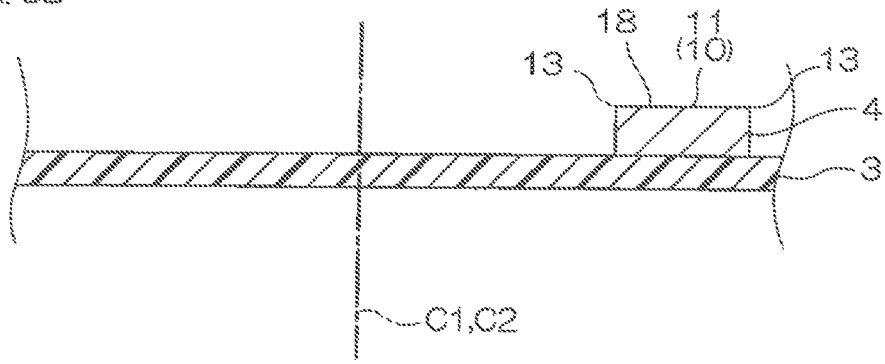
FIG. 3C
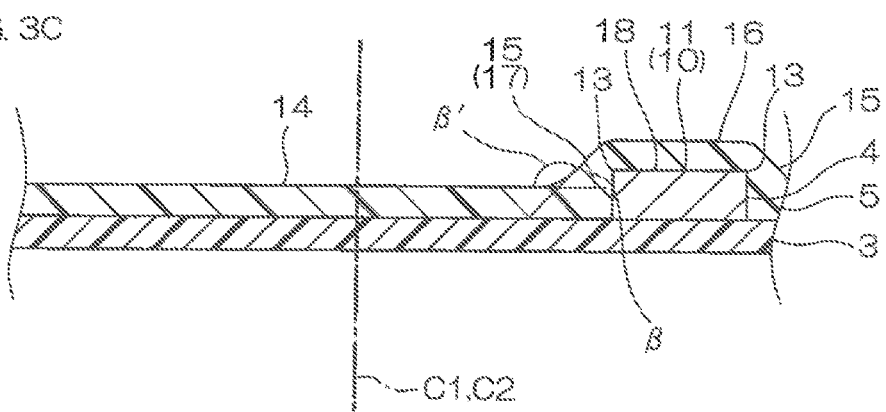

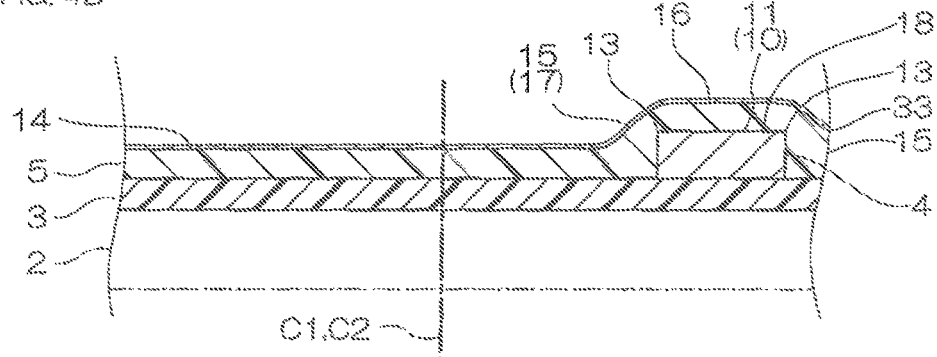
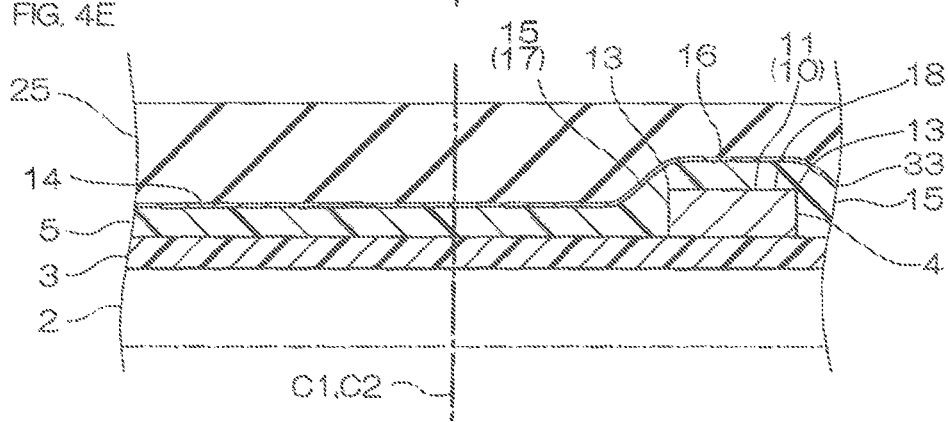
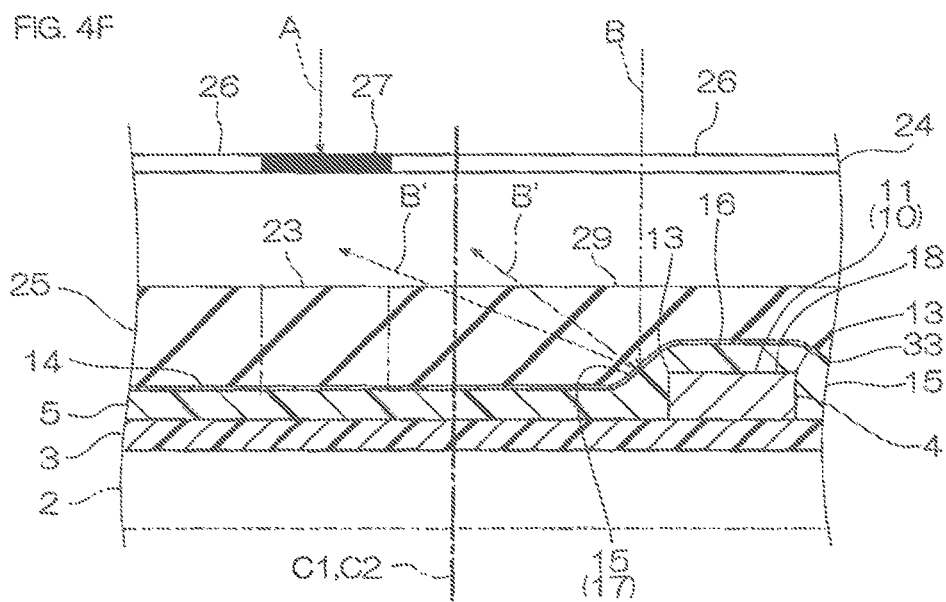

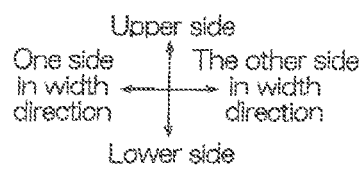
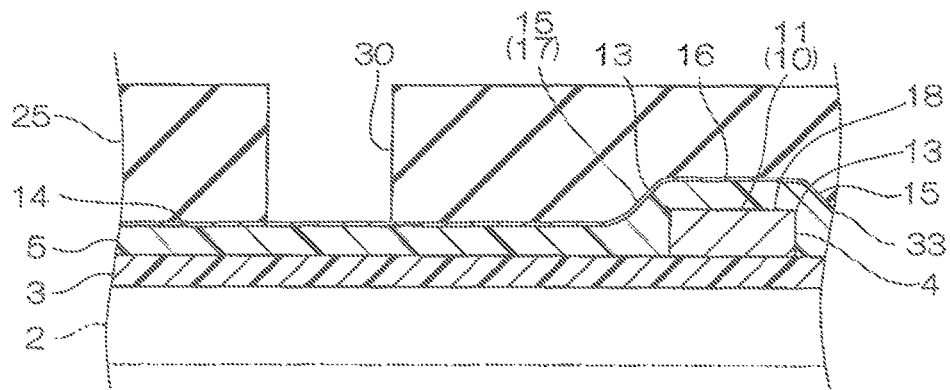
FIG. 5G
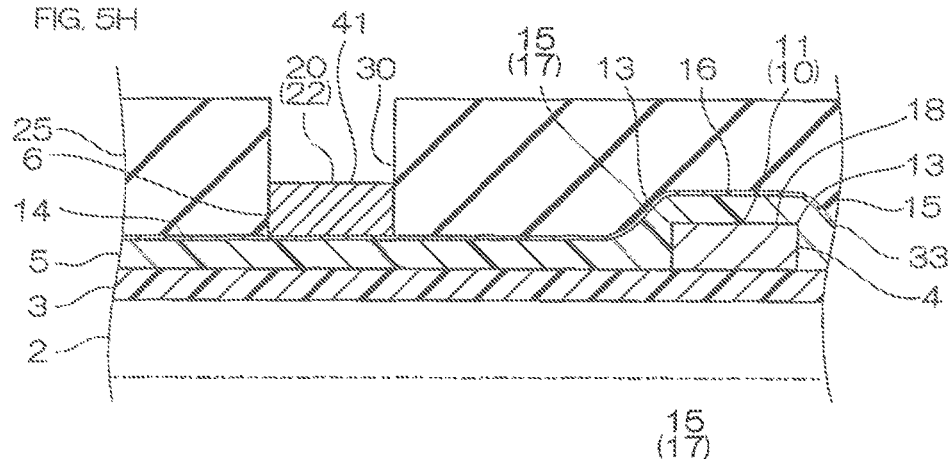
FIG. 5H
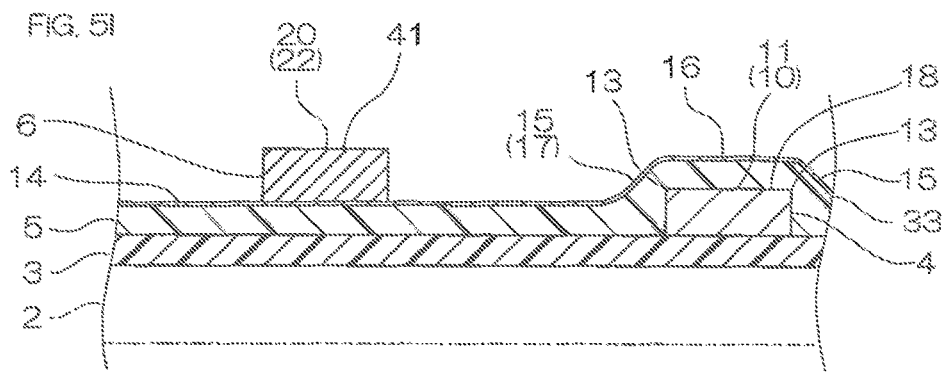
FIG. 5I

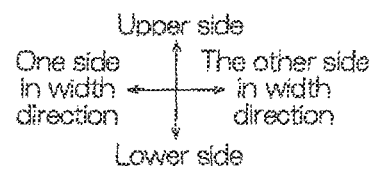
FIG. 6J
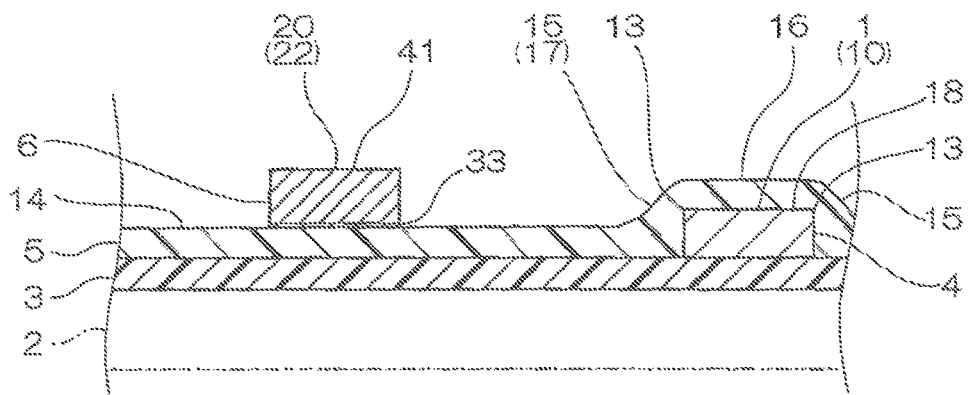
FIG. 6K
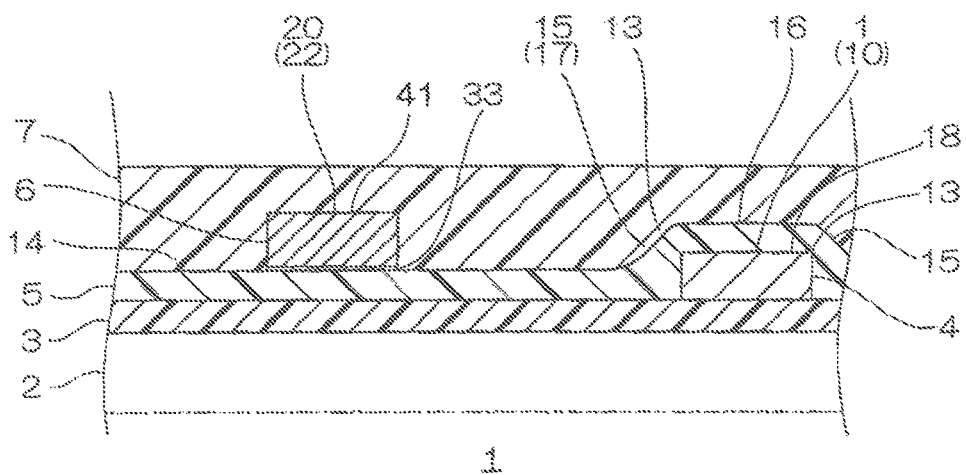

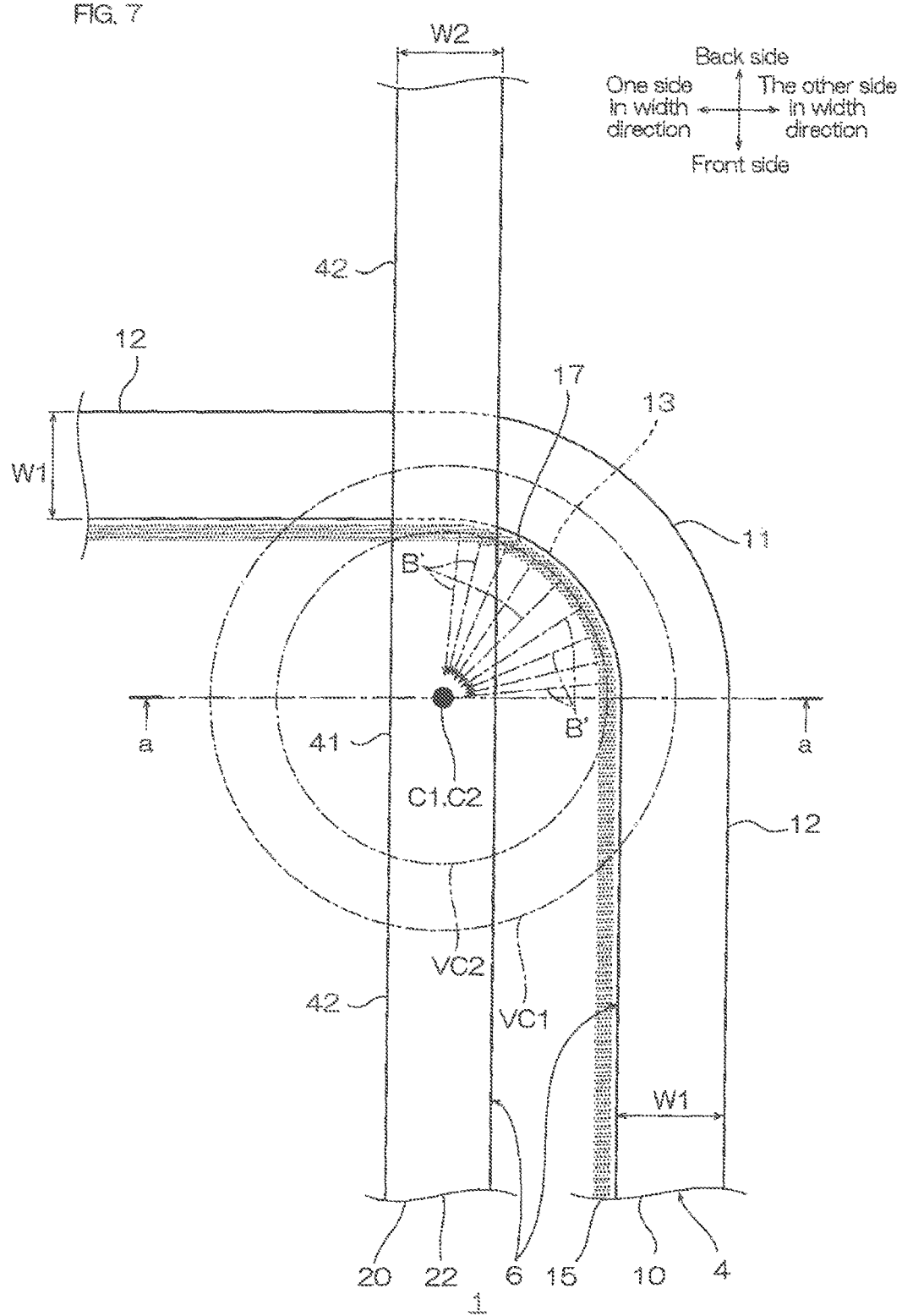

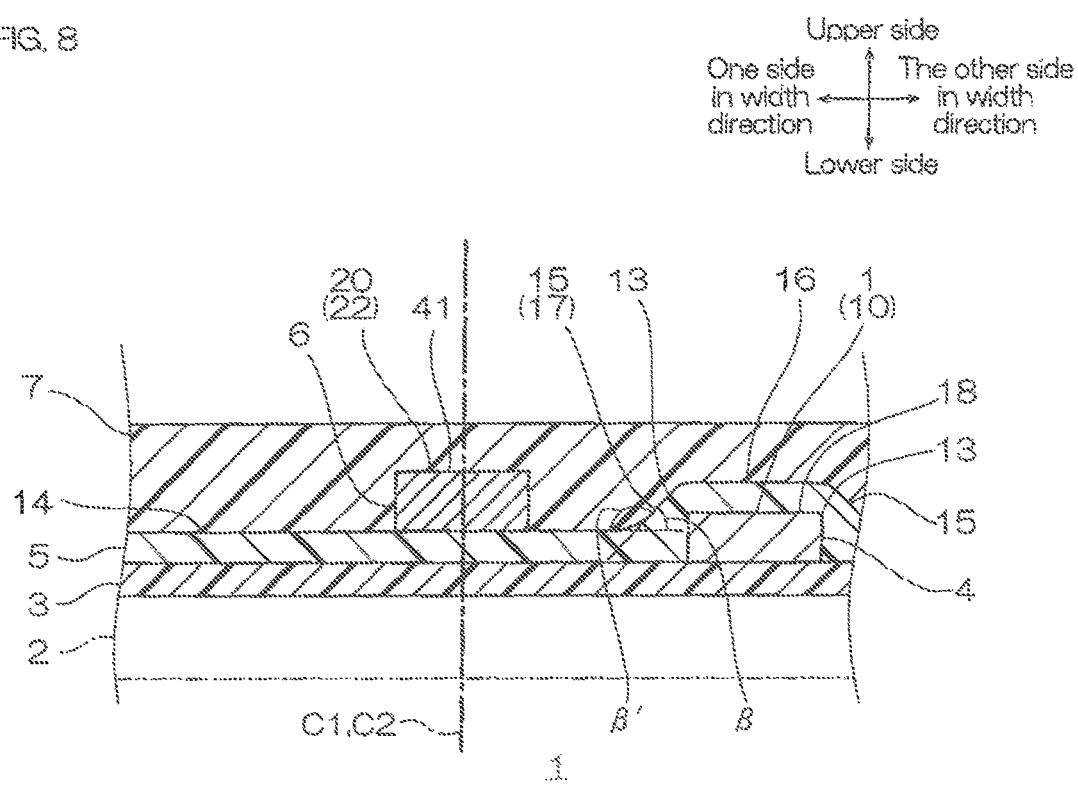

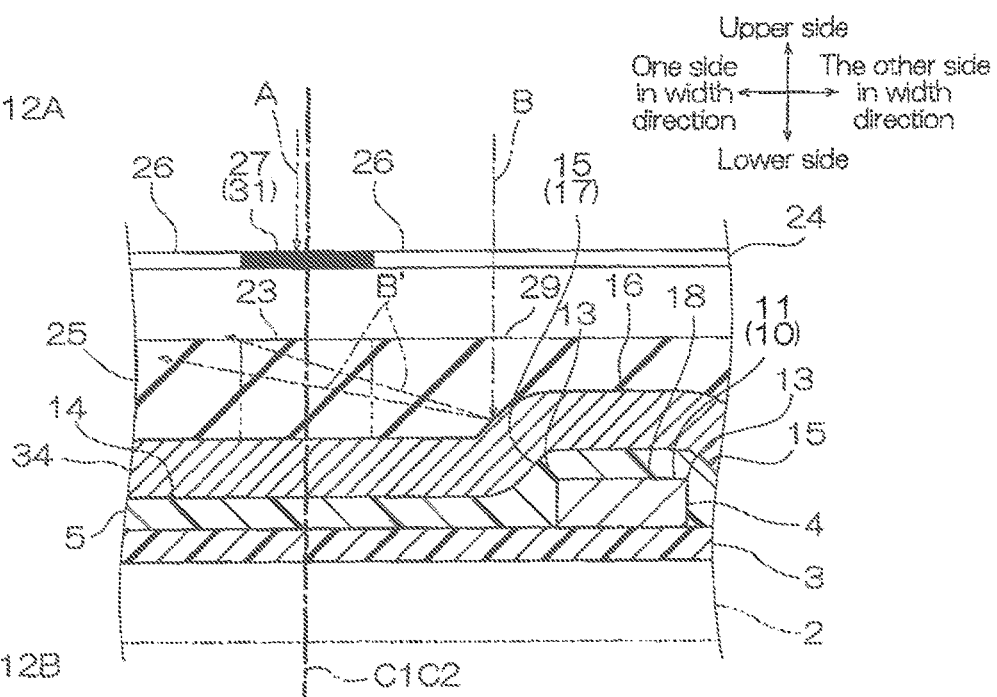
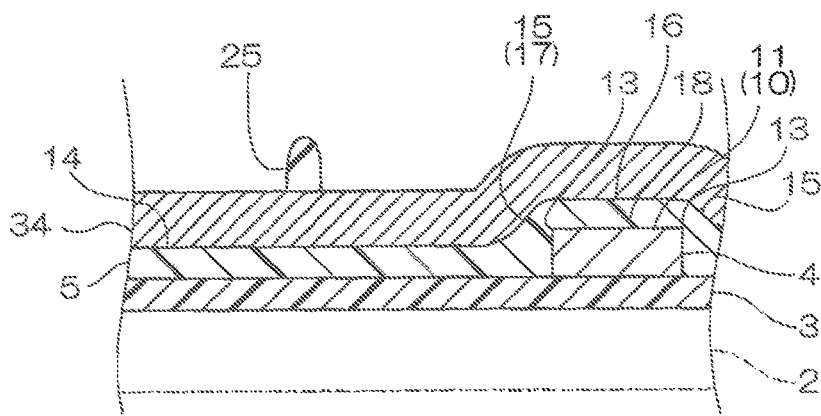
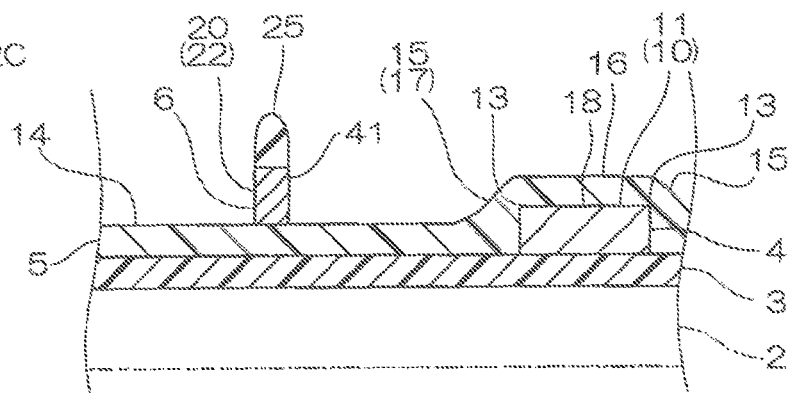

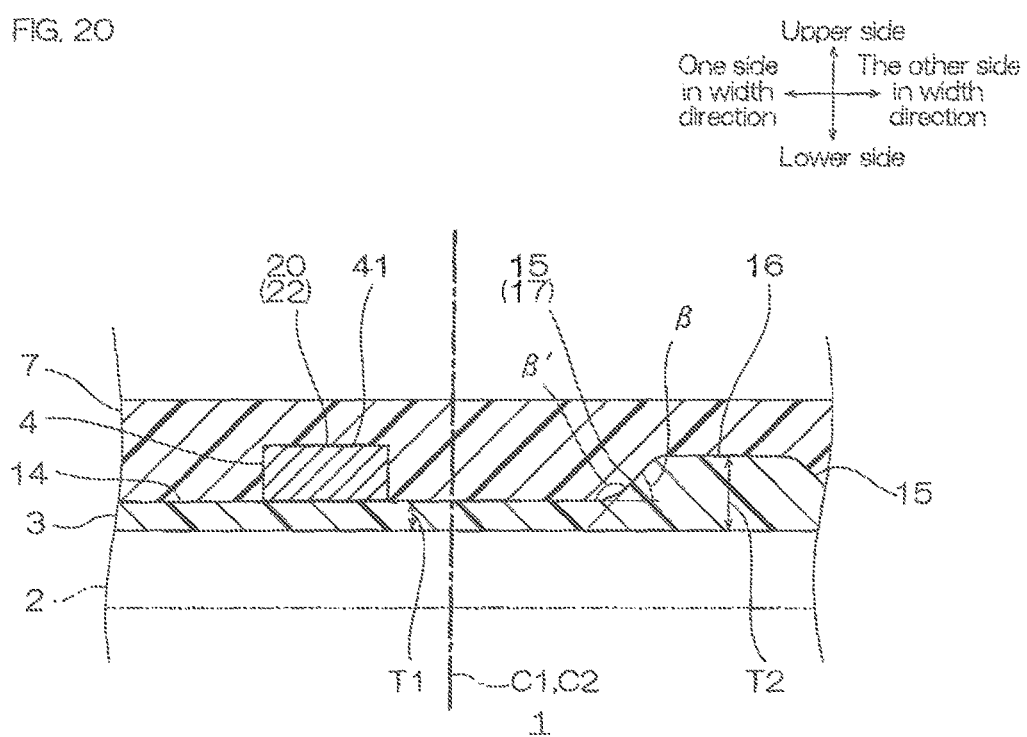

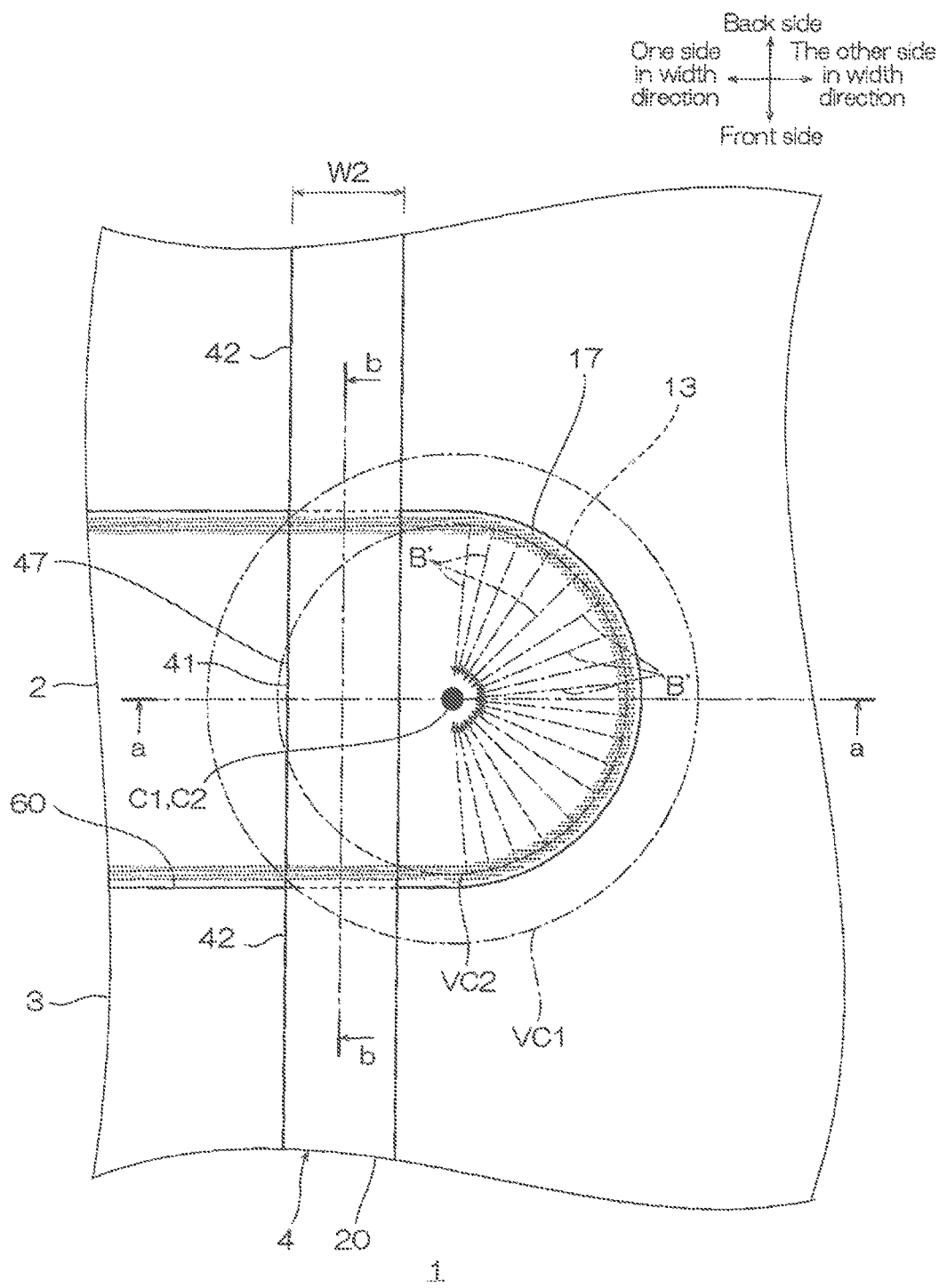

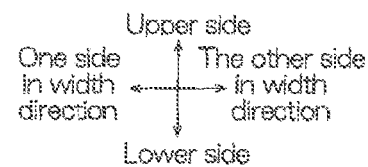
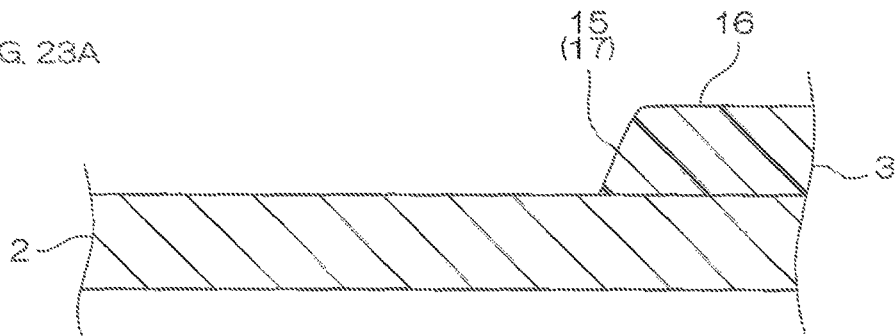
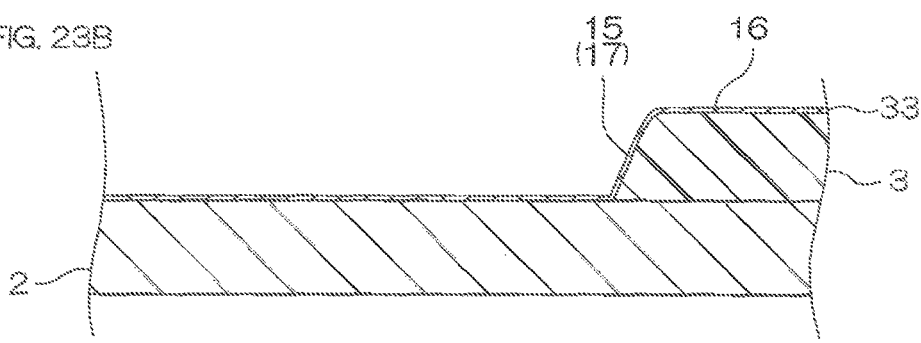
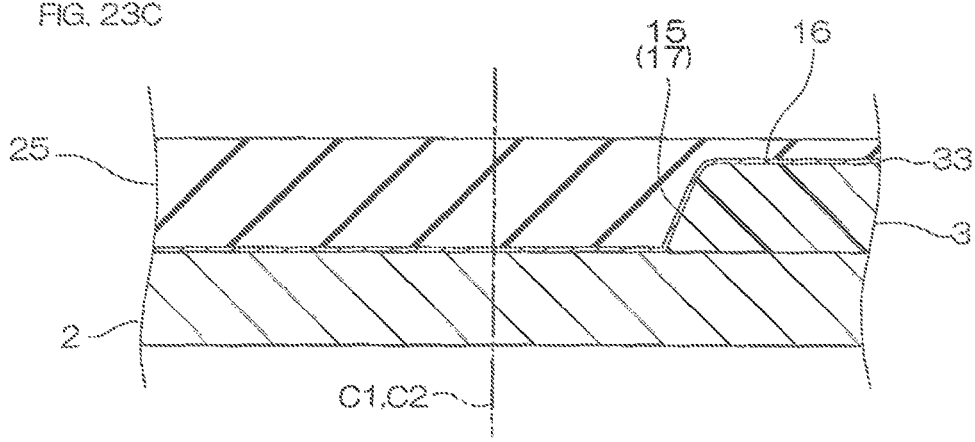

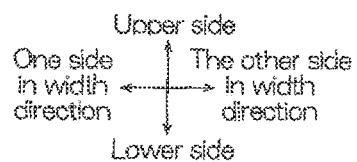
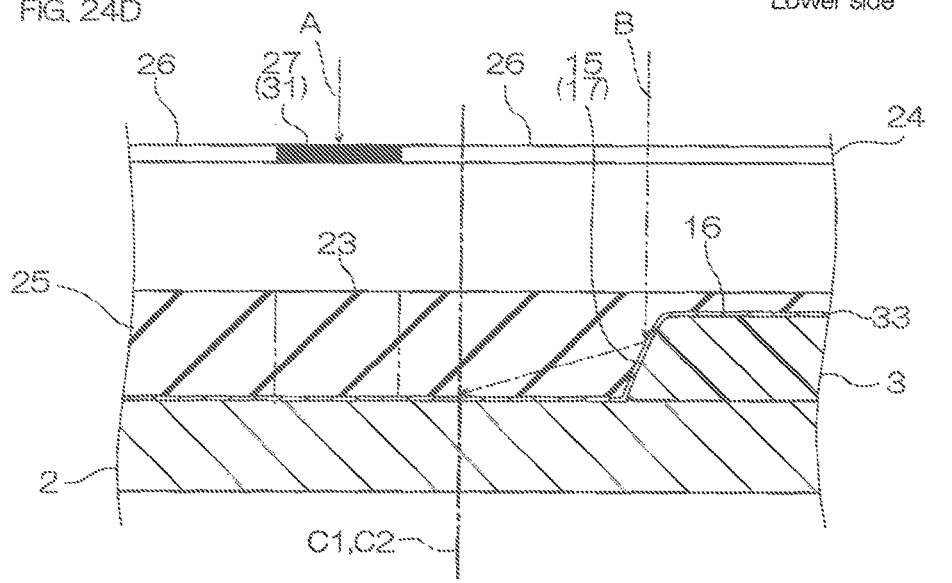
FIG. 24D
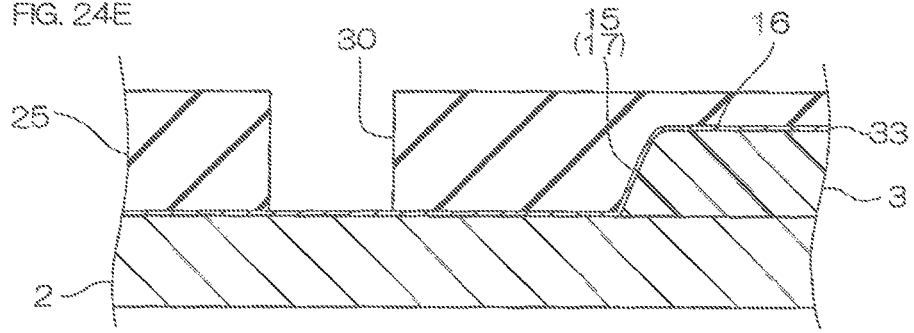
FIG. 24E
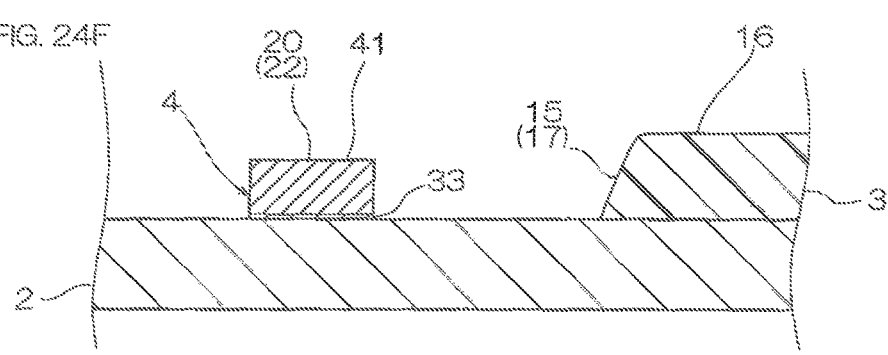
FIG. 24F

WIRED CIRCUIT BOARD AND PRODUCING METHOD THEREOF

CROSS-REFERENCE TO RELATED APPLICATION

This patent application is a divisional patent application of U.S. patent application Ser. No. 15/463,538, filed Mar. 20, 2017, which claims priority from Japanese Patent Application No. 2016-069039 filed on Mar. 30, 2016, the contents of all of which are hereby incorporated by reference into this application.

BACKGROUND OF THE INVENTION

Field of the Invention

The present invention relates to a wired circuit board and a production method thereof, in particular, to a method for producing a wired circuit board, and a wired circuit board produced by the method.

Description of Related Art

It has been known that a wired circuit board is produced by providing an insulating layer and a wiring pattern thereon.

For example, Japanese Unexamined Patent Publication No. 2014-127216 has proposed a method for producing a suspension board with circuit: the method includes a step of forming a first portion having a first thickness and a second portion having a second thickness that is smaller than the first thickness in the insulating layer, and a step of forming a wiring pattern so as to extend on the first portion and the second portion of the insulating layer.

To be specific, in the production method described in Japanese Unexamined Patent Publication No. 2014-127216, in the step of forming the wiring pattern, the wiring pattern is formed on the top face of the insulating layer so that the boundary between the top face and the boundary face of the first portion extends in a first direction, the side of the wiring pattern extends in a second direction crossing the first direction, and the second direction forms an angle of 60 degrees or more and 90 degrees or less relative to the first direction.

Because the boundary face is formed between the top face of the first portion and the top face of the second portion, in the step of forming the wiring pattern on the insulating layer by photo lithography technology, reflection of exposure light is caused at the boundary face, and the reflected light applies indirectly to other regions. However, in the method described in Japanese Unexamined Patent Publication No. 2014-127216, the exposure light is reflected in a direction that is close to the direction in which the wiring pattern extends at the boundary face, and therefore, the reflected light substantially does not affect the pattern of the original exposure light. Thus, breakage or short circuit is prevented in the wiring pattern formed by the photo lithography technology.

SUMMARY OF THE INVENTION

Recently, when producing a small-sized wired circuit board, sometimes a wiring pattern is disposed with a complicated pattern. In such a case, the wiring pattern may not be formed so as to form an angle between the second direction and the first direction to be 60 degrees or more and 90 degrees or less as in Japanese Unexamined Patent Publication No. 2014-127216. Then, there are disadvantages in that inadequate formation of the wiring pattern cannot be prevented.

The present invention provides a method for producing a wired circuit board with which deformation of the conductive pattern can be suppressed, and a wired circuit board produced by the method.

The present invention (1) includes a method for producing a wired circuit board including an insulating layer and a conductive pattern, the method including the steps of:

a step (1), in which the insulating layer having an inclination face is provided;

a step (2), in which a metal thin film is provided at least on the inclination face of the insulating layer;

a step (3), in which a photoresist is provided on the surface of the metal thin film;

a step (4), in which a light shield portion of a photomask is disposed so that a first portion, where the conductive pattern is to be provided in the photoresist, is shielded from light, and the photoresist is exposed to light through the photomask;

a step (5), in which the first portion of the photoresist is removed to expose the metal thin film corresponding to the first portion; and a step (6), in which the conductive pattern is provided on the surface of the metal thin film exposed from the photoresist, wherein the inclination face has a generally arc shape when viewed from the top, in the step (4), the reflected light reflected at the metal thin film corresponding to the arc is focused on the photoresist corresponding to the center of the virtual circle along the arc, and in the step (4), the light shield portion of the photomask is disposed to deviate from the center, and to overlap with at least the virtual circle.

In the step (4), light reflected at the metal thin film corresponding to the arc is focused on the photoresist corresponding to the center of the virtual circle along the arc. Therefore, the amount of light at the photoresist corresponding to the center of the virtual circle along the arc is relatively high.

Then, in the step (5), the portion, where the conductive pattern is to be provided in the photoresist, cannot be removed, and therefore, the metal thin film corresponding to the portion cannot be exposed, and because of this, in the step (6), a conductive pattern with deformation is provided.

However, with the method, in the step (4), the light shield portion of the photomask is disposed to deviate from the center, and therefore, even if the light reflected at the metal thin film corresponding to the arc is focused on the photoresist corresponding to the center of the virtual circle along the arc, light focusing on the portion, where the conductive pattern is to be provided in the photoresist, can be avoided (suppressed).

Therefore, in the step (5), the portion, where the conductive pattern is to be provided in the photoresist, can be reliably removed, and therefore, the metal thin film corresponding to the portion can be exposed. Therefore, in the step (6), a conductive pattern in which deformation is suppressed can be provided.

As a result, a wired circuit board with excellent connection reliability can be produced.

The present invention (2) includes a method for producing a wired circuit board including an insulating layer and a conductive pattern, the method including the steps of:

a step (1), in which the insulating layer having an inclination face is provided, a step (2), in which a conductive layer is provided at least on the inclination face of the insulating layer, a step (3), in which a photoresist is provided on the surface of the conductive layer, a step (4), in which a light shield portion of a photomask is disposed so that a first portion, where the conductive pattern is to be provided in the photoresist, is shielded from light, and the photoresist is exposed to light through the photomask;

a step (5), in which the photoresist other than the first portion is removed so as to leave the first portion of the photoresist;

a step (6), in which the conductive layer exposed from the photoresist is removed to form the conductive pattern;

wherein the inclination face has a generally arc shape when viewed from the top, in the step (4), light reflected at the conductive layer corresponding to the arc is focused on the photoresist corresponding to the center of the virtual circle along the arc, and in the step (4), the light shield portion of the photomask is disposed so as to deviate from the center, and to overlap with at least the virtual circle.

In the step (4), the light reflected at the conductive layer corresponding to the arc is focused on the photoresist corresponding to the center of the virtual circle along the arc. Therefore, the amount of light at the photoresist corresponding to the center of the virtual circle along the arc is relatively high.

Then, in the step (5), the portion, where the conductive pattern is to be provided in the photoresist, cannot be left, and therefore, the conductive layer corresponding to the portion cannot be left, and because of this, in the step (6), a conductive pattern with deformation is provided.

However, with the method, in the step (4), the light shield portion of the photomask is disposed so as to deviate from the center, and therefore, even if the light reflected at the conductive layer corresponding to the arc is focused on the photoresist corresponding to the center of the virtual circle along the arc, light focusing on the portion, where the conductive pattern is to be provided in the photoresist, can be avoided (suppressed).

Therefore, in the step (5), the portion, where the conductive pattern is to be provided in the photoresist, can be reliably left, and therefore, the conductive layer corresponding to the portion can be formed into a pattern. Therefore, in the step (6), a conductive pattern in which deformation is suppressed can be provided.

As a result, a wired circuit board with excellent connection reliability can be produced.

The present invention (3) includes a method for producing a wired circuit board of (1) or (2), wherein the conductive pattern does not pass through the center but passes through the virtual circle.

In this method, the conductive pattern does not pass through the center but passes through the virtual circle, and therefore, the conductive pattern can be provided with a high density.

The present invention (4) includes the method for producing a wired circuit board of any one of (1) to (3), wherein the conductive pattern is partially cut out to form a cutout, and the cutout overlaps with the center when viewed from the top.

With the method, light focusing on the photomask can be avoided with a simple configuration in which a cutout is provided in the conductive pattern.

The present invention (5) includes the method for producing a wired circuit board of any one of (1) to (3), wherein when viewed from the top, the outer shape of the conductive pattern includes the center and the conductive pattern has an opening including the center.

With the method, with a simple configuration in which an opening is provided in the conductive pattern, light focusing on the photomask can be avoided.

The present invention (6) includes the method for producing a wired circuit board of any one of (1) to (5), wherein in the step (6), the conductive pattern is provided above and below the insulating layer.

With the method, the two-layer conductive pattern can be electrically insulated with an insulating layer.

The present invention (7) includes the method for producing a wired circuit board of any one of (1) to (5), wherein the wired circuit board further includes a metal supporting board, and in the step (6), the conductive pattern is provided on the metal supporting board.

With the method, the conductive pattern can be conducted with the metal supporting board.

The present invention (8) includes a wired circuit board including a conductive pattern and an insulating layer having an inclination face, wherein the inclination face has a generally arc shape when viewed from the top, and the conductive pattern has an inner circle portion that deviates from the center of the virtual circle along the arc and is disposed in at least the virtual circle.

When the conductive pattern overlaps with the center of the virtual circle along the arc, in the photoprocessing of the production step of the wired circuit board, because of the unintended reflected light corresponding to the arc, light is focused on the portion, where the conductive pattern is to be provided in the photoresist, and because of the light focusing, the conductive pattern is deformed.

However, with the wired circuit board, even if the conductive pattern has the inner circle portion, it deviates from the center of the virtual circle along the arc, and therefore, even if light is focused on the portion, where the conductive pattern is to be provided in the photoresist, deformation of the conductive pattern that deviates from the center can be avoided.

Therefore, the wired circuit board has excellent connection reliability.

With the method for producing a wired circuit board of the present invention, the wired circuit board with excellent connection reliability can be produced.

The wired circuit board of the present invention has excellent connection reliability.

BRIEF DESCRIPTION OF THE DRAWINGS

FIG. 2 shows a cross-sectional view along line a-a of the wired circuit board shown in FIG. 1.

FIG. 3A to FIG. 3C show a first embodiment of the method for producing a wired circuit board of the present invention, illustrating process diagrams of the method for producing a wired circuit board shown in FIG. 2:

FIG. 3A illustrating a step (i), in which an insulating base layer is prepared,

FIG. 3B illustrating a step (ii), in which a first conductive pattern is provided, and FIG. 3C illustrating a step (1), in which an intermediate insulating layer is provided.

FIG. 4D to FIG. 4F show, following FIG. 3C, the first embodiment of the method for producing a wired circuit board of the present invention, illustrating process diagrams of the first embodiment of the method for producing a wired circuit board:

FIG. 4D illustrating a step (2), in which a metal thin film is provided,

FIG. 4E illustrating a step (3), in which a photoresist is provided, and

FIG. 4F illustrating a step (4), in which a photoresist is exposed to light.

FIG. 5G to FIG. 5I show, following FIG. 4F, the first embodiment of the method for producing a wired circuit board of the present invention, illustrating process diagrams of the first embodiment of the method for producing a wired circuit board, FIG. 5G illustrating a step (4), in which the first portion of the photoresist is removed, FIG. 5H illustrating a step (5), in which a second conductive pattern is provided, and FIG. 5I illustrating a step (iii), in which the photoresist is removed.

FIG. 6J and FIG. 6K show, following FIG. 5I, the first embodiment of the method for producing a wired circuit board of the present invention, illustrating process diagrams of the first embodiment of the method for producing a wired circuit board:

FIG. 6J illustrating a step (iv), in which the metal thin film corresponding to the photoresist is removed, and FIG. 6K illustrating a step (v), in which the insulating cover layer is provided.

FIG. 7 shows a plan view of a wired circuit board of prior art (Comparative Example).

FIG. 8 shows a cross-sectional view along line a-a of the wired circuit board shown in FIG. 7.

FIG. 9A illustrating a step (4), in which a photoresist is exposed to light,

FIG. 9B illustrating a step (5), in which the first portion of the photoresist is removed, and FIG. 9C illustrating a step (6), in which the second conductive pattern is provided.

FIG. 11D illustrating a step (5), in which the conductive layer exposed from the photoresist is removed to form the second conductive pattern, FIG. 11E illustrating a step of removing the photoresist, and FIG. 11F illustrating a step (v), in which the insulating cover layer is provided.

FIG. 12A to FIG. 12C show production steps of a wired circuit board of prior art corresponding to the second embodiment (Comparative Example):

FIG. 12A illustrating a step (4), in which a photoresist is provided, a photomask is disposed, and the photoresist is exposed to light, FIG. 12B illustrating a step (5), in which the portion other than the first portion is removed in the photoresist, and FIG. 12C illustrating a step (6), in which a second conductive pattern with deformation is formed.

FIG. 20 shows a cross-sectional view of a modified example of the wired circuit board in the first embodiment.

FIG. 21 shows a plan view of the wired circuit board in an eighth embodiment of the present invention.

FIG. 22A illustrating a cross-sectional view along line a-a, and

FIG. 22B illustrating a cross-sectional view along line b-b.

FIG. 23A to FIG. 23C are process diagrams illustrating production of the wired circuit board shown in FIG. 22A:

FIG. 23A illustrating a step (i), in which an insulating base layer is provided on the metal supporting board, FIG. 23B illustrating a step (2), in which a metal thin film is provided, and FIG. 23C illustrating a step (3), in which a photoresist is provided.

FIG. 24D to FIG. 24F show, following FIG. 23C, process diagrams illustrating production of the wired circuit board shown in FIG. 22A:

FIG. 24D illustrating a step (4), in which a photoresist is exposed to light,

FIG. 24E illustrating a step (5), in which the first portion of the photoresist is removed, and FIG. 24F illustrating a step in which a first conductive pattern is formed.

FIG. 26A illustrating a step (4), in which a photoresist is exposed to light,

FIG. 26B illustrating a step (5), in which the first portion of the photoresist is removed, and FIG. 26C illustrating a step (6), in which a first conductive pattern is provided.

FIG. 29A illustrating a step (4), in which a photoresist is exposed to light,

FIG. 29B illustrating a step (5), in which the first portion of the photoresist is removed, and FIG. 29C illustrating a step (6), in which a second conductive pattern having a conductor opening is provided.

DETAILED DESCRIPTION OF THE INVENTION

Figure 1:
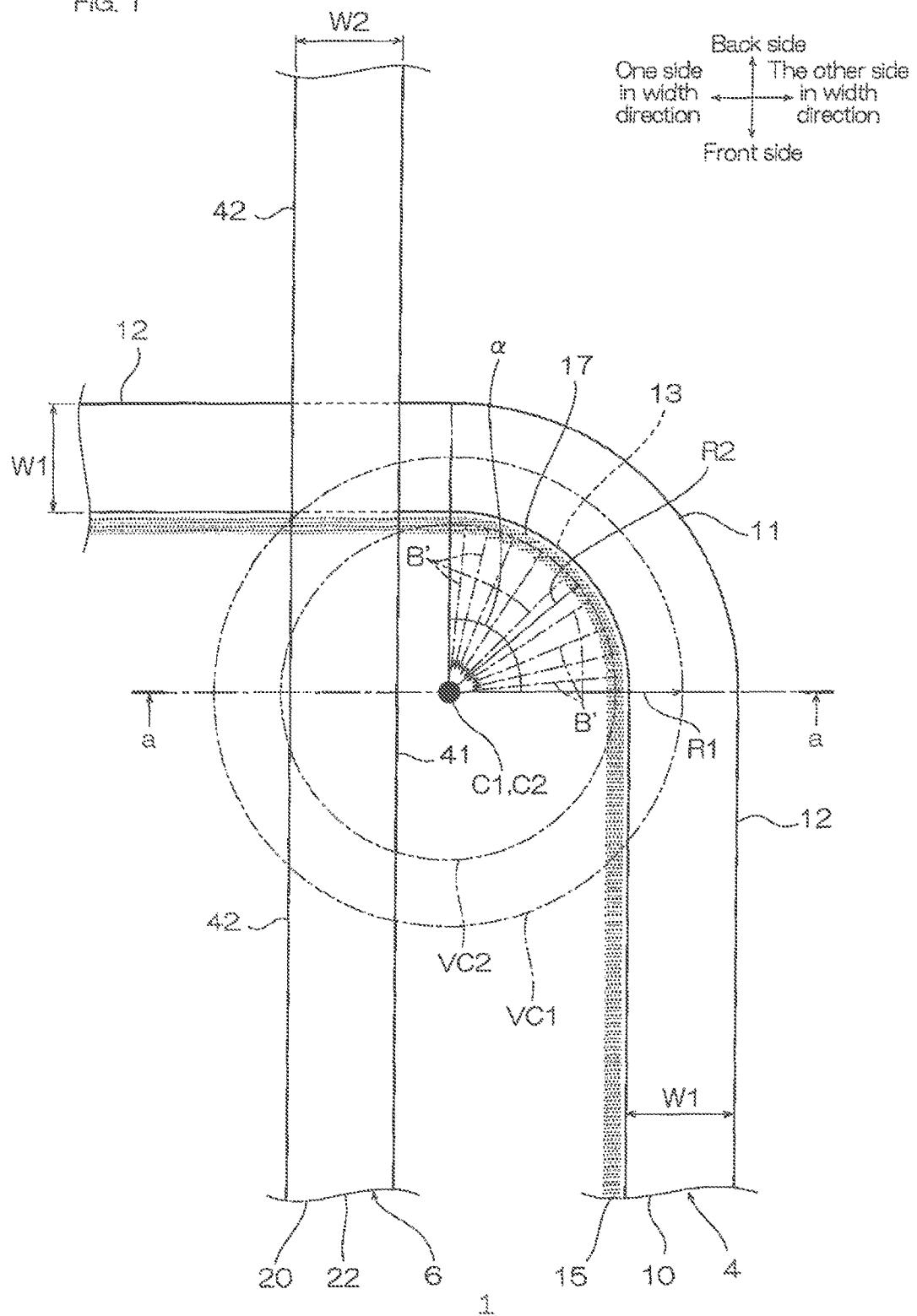
FIG. 1 shows a plan view of the wired circuit board of the present invention in a first embodiment.

In FIG. 1, up-down direction in the plane of the paper is front-back direction (first direction), lower side is front side (one side in the first direction), and upper side in the plane of the paper is back side (the other side in the first direction).

In FIG. 1, left-right direction in the plane of the paper is width direction (second direction perpendicular to the first direction), left side in the plane of the paper is one side in the width direction (one side in the second direction), and right side in the plane of the paper is the other side in the width direction (the other side in the second direction).

In FIG. 1, paper thickness direction in the plane of the paper is up-down direction (third direction perpendicular to the first direction and the second direction, thickness direction), near side in the plane of the paper is upper side (one side in the third direction, one side in the thickness direction), and further side in the plane of the paper is lower side (the other side in the third direction, the other side in the thickness direction). The directions are, to be specific, in accordance with the direction arrows in the figures. The definition of the directions does not intend to limit the directions of the wired circuit board at the time of production and use thereof.

In FIG. 1, FIG. 7, FIG. 13 to FIG. 15, FIG. 17, FIG. 18, and FIG. 20, to clearly show the relative positions of a first conductive pattern 4 and a second conductive pattern 6 described later, an insulating base layer 3, an intermediate insulating layer 5, and an insulating cover layer 7 described later are omitted. However, only a base arc portion 17 of the intermediate insulating layer 5 is shown in halftone.

Figure 25:
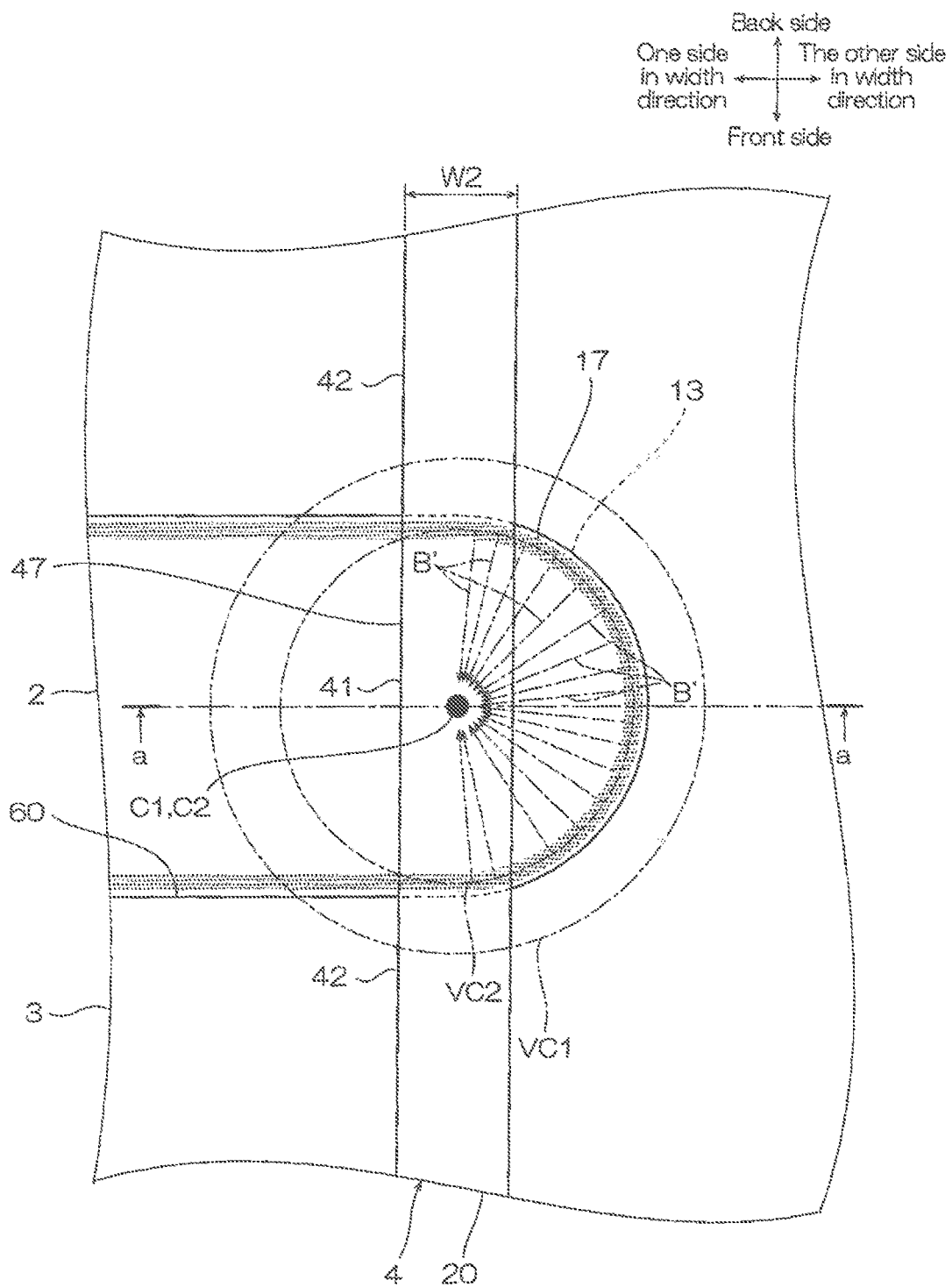
FIG. 25 shows a plan view of a wired circuit board of prior art corresponding to the eighth embodiment (Comparative Example).
Figure 27:
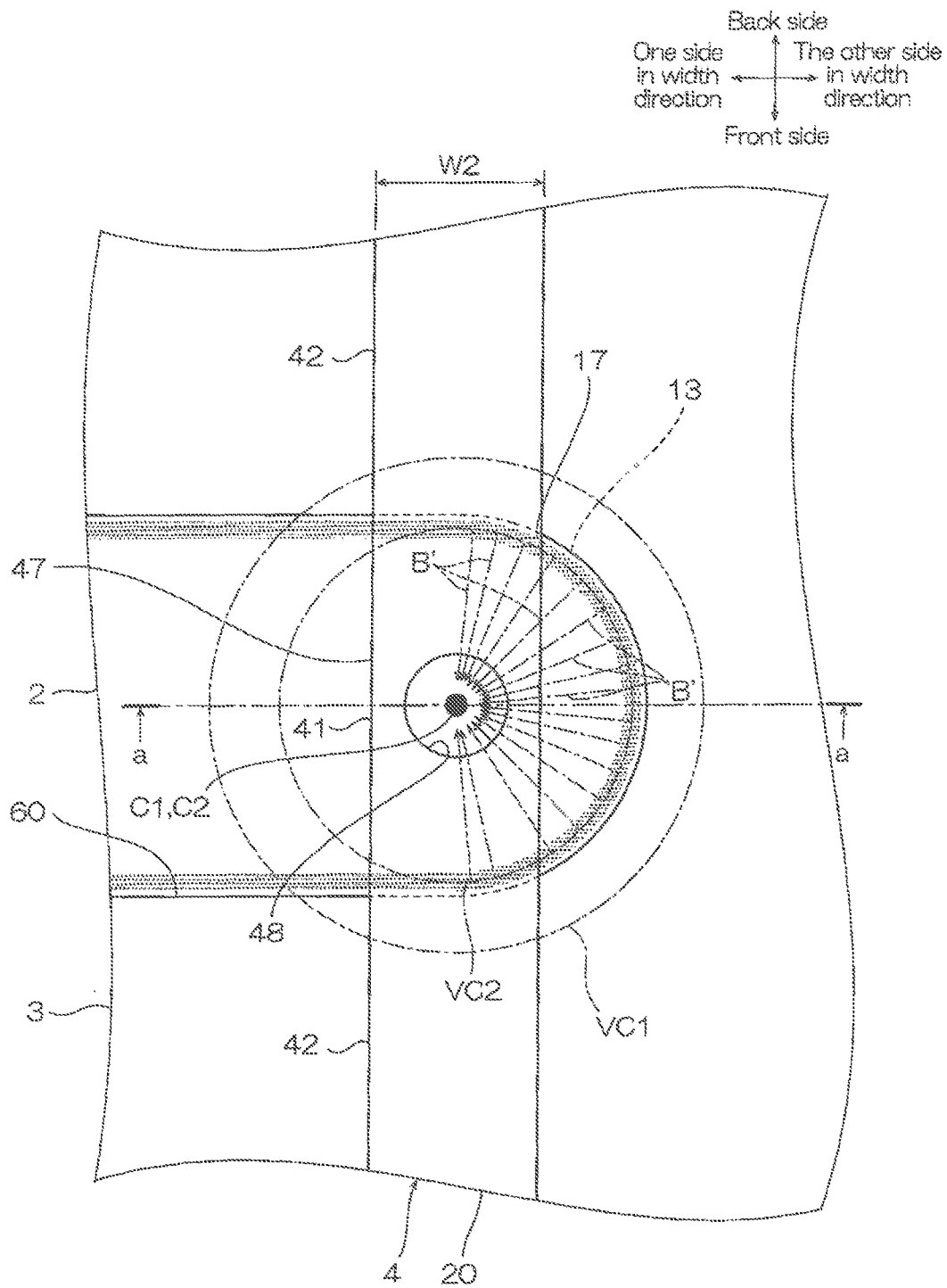
FIG. 27 shows a plan view of the wired circuit board in an eighth embodiment of the present invention.

In FIG. 21, FIG. 25, and FIG. 27, to clearly show the relative positions of the insulating base layer 3 and the first conductive pattern 4, the insulating cover layer 7 described later is omitted. However, only the base arc portion 17 of the insulating base layer 3 is shown in halftone.

First Embodiment

The wired circuit board of the present invention has a single layer or a plurality of layers of the conductive pattern, and its layer structure is not particularly limited. The wired circuit board includes a suspension board with circuits including a metal supporting board, and a flexible wired circuit board (FPC) including no metal supporting board.

In the following, a first embodiment of the wired circuit board and its production method of the present invention are described sequentially.

1. Wired Circuit Board

As shown in FIG. 1 and FIG. 2, a wired circuit board 1 includes the insulating base layer 3, the first conductive pattern 4 provided on the insulating base layer 3 as an example of the conductive pattern, the intermediate insulating layer 5 provided on the insulating base layer 3 as an example of the insulating layer and covering the first conductive pattern 4, the second conductive pattern 6 disposed on the intermediate insulating layer 5 as an example of the conductive pattern, and the insulating cover layer 7 provided on the intermediate insulating layer 5 and covering the second conductive pattern 6.

The insulating base layer 3 has a generally flat plate (sheet) shape extending in the front-back direction. The insulating base layer 3 is made of an insulating material. Examples of the insulating material include synthetic resins such as polyimide resin, polyamide-imide resin, acrylic resin, polyether resin, nitrile resin, polyether sulfone resin, polyethylene terephthalate resin, polyethylenenaphthalate resin, and polyvinyl chloride resin, and preferably, polyimide resin is used. The insulating base layer 3 has a thickness of, for example, 1 μm or more, preferably 3 μm or more, and for example, 25 μm or less, preferably 15 μm or less.

The first conductive pattern 4 integrally includes a first wire 10, and a first terminal (not shown) provided at both ends of the first wire 10.

The first wire 10 includes a generally L-shaped portion when viewed from the top. To be specific, the first wire 10 integrally includes a first arc portion 11 having an arc shape, and two first linear portions 12 continued from both ends of the first arc portion 11.

The first arc portion 11 is bent toward one side in the width direction as it approaches the back side.

The virtual circle VC1 (to be specific, virtual circle VC1 along the center of the width W1 of the first arc portion 11) along the first arc portion 11 has a radius R1 of, for example, 5 μm or more, preferably 15 μm or more, and for example, 300 μm or less, preferably 100 μm or less.

The central angle α of the first arc portion 11 is not particularly limited, and for example, more than 0 degree, preferably 30 degrees or more, more preferably 45 degrees or more, and for example, 180 degrees or less, preferably 90 degrees or less.

The two first linear portions 12 are disposed so that their extension lines cross (to be specific, cross at right angles). Of the two first linear portions 12, one extends from the front end portion of the first arc portion 11 toward the front side when viewed from the top, and the other extends from one end portion in the width direction of the first arc portion 11 toward one side in the width direction when viewed from the top.

The first wire 10 (first arc portion 11 and first linear portion 12) has a generally rectangular shape when viewed in cross section. The first wire 10 has two ridgeline portions 13 at the upper end portion.

The first conductive pattern 4 has a thickness of, for example, 1 μm or more, preferably 3 μm or more, and for example, 20 μm or less, preferably 12 μm or less. The width W1 of the first wire 10 is not particularly limited, to be specific, for example, 5 μm or more, preferably 8 μm or more, and for example, 200 μm or less, preferably 100 μm or less.

The intermediate insulating layer 5 is disposed at the top face of the insulating base layer 3 so as to cover the side face and a top face 16 of the first conductive pattern 4. Although not shown, the intermediate insulating layer 5 allows the first terminal (not shown) of the first conductive pattern 4 to expose. The intermediate insulating layer 5 has a top face including a first flat face 14, an inclination face 15, and a second flat face 16.

The first flat face 14 is a face parallel to a surface direction (direction along the surface of the insulating base layer 3), and is a face facing the top face of the insulating base layer 3 exposed from the first conductive pattern 4 in the thickness direction.

The inclination face 15 corresponds to the first wire 10, continues from the first flat face 14, and is a face inclined relative to the surface direction. To be specific, the inclination face 15 is a face that inclines (elevates) upward from the first flat face 14 in correspondence with the two ridgeline portions 13 of the first wire 10.

The supplementary angle β to the angle β' formed with the inclination face 15 and the first flat face 14, that is, the gradient β of the inclination face 15 relative to the first flat face 14 is not particularly limited, and for example, the gradient β is 5 degrees or more, preferably 20 degrees or more, and for example, less than 90 degrees, preferably 60 degrees or less.

Figure 9A:
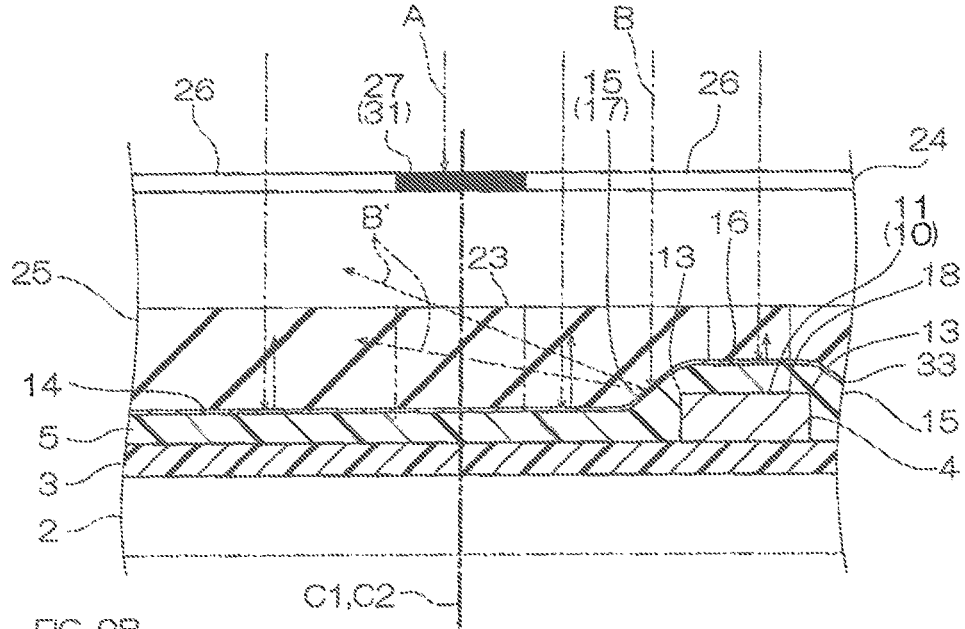
FIG. 9A to FIG. 9C are process diagrams illustrating the method for producing a wired circuit board shown in FIG. 8.

The inclination face 15 includes, although described later, as shown in FIG. 7 and FIG. 9A, the base arc portion 17 that allows a reflected light B' at a metal thin film 33 to reach a first portion 23, i.e., an example of the portion, where the second conductive pattern 6 is to be provided (should be provided) in a photoresist 25.

To be specific, the base arc portion 17 is a portion at one side in the width direction (inner side portion) of the two inclination faces 15 corresponding to the two ridgeline portions 13 at the first arc portion 11. The base arc portion 17 has an arc shape similar to the arc shape of the ridgeline portion 13 when viewed from the top. The base arc portion 17 is continuously bent toward one side in the width direction. The center C2 of the virtual circle VC2 along the base arc portion 17 and the center C1 of the virtual circle VC1 along the first arc portion 11 are at the same position when viewed from the top. The virtual circle VC2 along the base arc portion 17 (to be specific, virtual circle VC2 along the center in the width direction of the base arc portion 17) has a radius R2 of, for example, 5 μm or more, preferably 15 μm or more, and for example, 300 μm or less, preferably 100 μm or less.

The second flat face 16 corresponds to a top face 18 that connects the two ridgeline portions 13 of the first wire 10, and is disposed to face above the top face 18 in spaced-apart relation. The second flat face 16 connects the upper end portion of the two inclination faces 15. The second flat face 16 is parallel to the first flat face 14.

The intermediate insulating layer 5 is made of the insulating material given as examples of the insulating base layer 3. The intermediate insulating layer 5 has a thickness of, for example, 1 μm or more, preferably 3 μm or more, and for example, 35 μm or less, preferably 33 μm or less.

The second conductive pattern 6 integrally includes a second wire 20, and a second terminal (not shown) provided at both ends of the second wire 20.

The second wire 20 includes a second linear portion 22 extending in the front-back direction. The second linear portion 22 is parallel to the first linear portion 12 (first linear portion 12 along the front-back direction) at the front side of the first conductive pattern 4 when projected in the thickness direction.

The second linear portion 22 crosses the first linear portion 12 (first linear portion 12 along the left-right direction) at the back side of the first conductive pattern 4 when projected in the thickness direction. The second linear portion 22 has an inner side portion 41 positioned at the inner side portion of the virtual circle VC2 along the base arc portion 17 when viewed from the top as an example of the inner circle portion, and an outer side portion 42 positioned outside of the virtual circle VC2 when viewed from the top.

The second linear portion 22 is disposed in spaced-apart relation relative to the center C2 (center C1 of the virtual circle VC1 along the first arc portion 11) of the arc of the base arc portion 17. To be specific, the inner side portion 41 is disposed in spaced-apart relation at one side in the width direction relative to the center C2 of the arc of the base arc portion 17. The second linear portion 22 does not pass through the center C1 of the virtual circle VC1 along the first arc portion 11 when viewed from the top, but passes through the virtual circle VC2 along the base arc portion 17.

The second linear portion 22 is disposed at the top face of the first flat face 14 of the intermediate insulating layer 5. The second wire 20 has a generally rectangular shape when viewed in cross section.

The second conductive pattern 6 is made of the same conductive material as that of the first conductive pattern 4.

The size of the second conductive pattern 6 is set suitably. The second conductive pattern 6 has a thickness of, for example, 1 μm or more, preferably 3 μm or more, and for example, 20 μm or less, preferably 12 μm or less. The second wire 20 has a width W2 of, for example, 5 μm or more, preferably 8 μm or more, and for example, 200 μm or less, preferably 100 μm or less.

The interval between the inner side portion 41 and the center C1 (center C2 of the virtual circle VC2 along the base arc portion 17) of the virtual circle VC1 along the first arc portion 11 is, for example, 2 μm or more, preferably 5 μm or more, more preferably 10 μm or more, and for example, 300 μm or less, preferably 200 μm or less, more preferably 100 μm or less.

The insulating cover layer 7 is disposed so as to cover the side face and the top face of the second conductive pattern 6 at the top face of the intermediate insulating layer 5. Although not shown, the insulating cover layer 7 allows the second terminal (not shown) of the second conductive pattern 6 to expose. The insulating cover layer 7 is made of the insulating material given as the examples of the insulating base layer 3. The insulating cover layer 7 has a thickness of, for example, 1 μm or more, preferably 3 μm or more, and for example, 40 μm or less, preferably 10 μm or less.

2. Method for Producing a Wired Circuit Board

Next, description is given below of the production method of the wired circuit board 1 with reference to FIG. 3A to FIG. 6K.

The production method of the wired circuit board 1 includes a step (i) (ref: FIG. 3A), in which the insulating base layer 3 is prepared, a step (ii) (ref: FIG. 3B), in which the first conductive pattern 4 is provided on the insulating base layer 3, and a step (1) (ref: FIG. 3C), in which the intermediate insulating layer 5 is provided on the insulating base layer 3 so as to cover the first conductive pattern 4.

Furthermore, the production method of the wired circuit board 1 includes a step (2) (ref: FIG. 4D), in which the metal thin film 33 is provided at least on the inclination face 15 of the intermediate insulating layer 5, a step (3) (ref: FIG. 4E), in which the photoresist 25 is provided on the metal thin film 33, and a step (4) (ref: FIG. 4F), in which a photomask 24 is disposed so that the first portion 23, i.e., an example of a portion, where the second conductive pattern 6 is to be provided in the photoresist 25, is shielded from light, and the photoresist 25 is exposed to light through the photomask 24.

Furthermore, the production method of the wired circuit board 1 includes a step (5) (ref: FIG. 5G), in which the first portion 23 is removed to expose the metal thin film 33 corresponding to the first portion 23, and a step (6) (ref:

phantom line in FIG. 5H), in which the second conductive pattern 6 is provided on the metal thin film 33 exposed from the photoresist 25.

Furthermore, the production method of the wired circuit board 1 includes a step (iii) (ref: FIG. 5I), in which the photoresist 25 is removed, a step (iv) (ref: FIG. 6J), in which the metal thin film 33 corresponding to the photoresist 25 is removed, and a step (v) (ref: FIG. 6K), in which the insulating cover layer 7 is provided on the intermediate insulating layer 5 so as to cover the second conductive pattern 6.

In the production method of the wired circuit board 1, the step (i) to step (ii), the step (1) to step (6), and the step (iii) to step (v) are performed sequentially. In the following, the above-described steps are described in detail.

2-1. Step (i)

As shown in FIG. 3A, in the step (i), the insulating base layer 3 is prepared.

2-2. Step (ii)

As shown in FIG. 3B, in the step (ii), the first conductive pattern 4 is provided on the insulating base layer 3.

2-3. Step (1)

As shown in FIG. 3C, in the step (1), the intermediate insulating layer 5 is provided on the insulating base layer 3 so as to cover the first conductive pattern 4.

To provide the intermediate insulating layer 5 on the insulating base layer 3, for example, varnish of a photosensitive insulating material is applied to the top face of the insulating base layer 3, exposed to light and developed, and thereafter, as necessary, heated. Alternatively, the intermediate insulating layer 5 preformed into a pattern which allows a first terminal, which is not shown, to be exposed is allowed to adhere onto the insulating base layer 3 with an adhesive, which is not shown, interposed therebetween.

At this time, in the intermediate insulating layer 5 corresponding to the first conductive pattern 4, the first flat face 14, the inclination face 15 including the base arc portion 17 (ref: FIG. 1), and the second flat face 16 are generated.

2-4. Step (2)

As shown in FIG. 4D, in the step (2), the metal thin film 33 is provided at least on the inclination face 15 of the intermediate insulating layer 5.

The metal thin film 33 can serve as a seed film (feeding layer) in the additive method of the step (6) (described later, ref: FIG. 5H). The metal thin film 33 is a layer that can be integrated with the second conductive pattern 6 when the second conductive pattern 6 is obtained in the additive method (ref: FIG. 2).

The metal thin film 33 is provided on the entire surface of, for example, the top face (including the first flat face 14, the inclination face 15 (including the base arc portion 17) and the second flat face 16) of the intermediate insulating layer 5.

The metal thin film 33 is made of a metal material. Examples of the metal material include copper, chromium, nickel, and an alloy thereof, and preferably, copper and chromium are used. The metal thin film 33 can be made of a single or a plurality of layers (not shown in FIG. 4D). Preferably, the metal thin film 33 is made of two layers of a first thin film (to be specific, chromium thin film), and a second thin film (copper thin film) provided thereon.

The metal thin film 33 is in conformity with the top face of the intermediate insulating layer 5. Therefore, in the metal thin film 33, the top face of the portion corresponding to the first flat face 14 and the second flat face 16 of the intermediate insulating layer 5 is parallel with the first flat face 14 and the second flat face 16, that is, is along the surface direction. Meanwhile, in the metal thin film 33, the top face of the portion corresponding to the inclination face 15 (including the base arc portion 17) is parallel with the inclination face 15 (including the base arc portion 17) of the intermediate insulating layer 5, that is, inclined relative to the surface direction.

The metal thin film 33 has a thickness of, for example, 10 nm or more, preferably 30 nm or more, and for example, 300 nm or less, preferably 200 nm or less. When the metal thin film 33 consists of two layers of the first thin film and the second thin film, the first thin film has a thickness of, for example, 10 nm or more, and 100 nm or less, and the second thin film has a thickness of, for example, 50 nm or more, and 200 nm or less.

To provide the metal thin film 33 on the intermediate insulating layer 5, for example, the sputtering method and the plating method are used, and preferably, sputtering method is used.

2-5. Step (3)

As shown in FIG. 4E, in the step (3), the photoresist 25 is provided on the metal thin film 33.

The photoresist 25 is a negative type photoresist (negative photoresist). The negative type photoresist is a resist that allows the portion which is exposed to the light of a predetermined amount or more at the time of exposure to remain in developing thereafter, and meanwhile, the portion which is shielded from light at the time of exposure (portion to which light of a predetermined amount or more is not applied, that is, portion to which light of less than the predetermined is allowed) to be removed in developing thereafter. The photoresist 25 includes, for example, dry film photoresist (DFR). The photoresist 25 can serve as, as shown in FIG. 5H, a plating resist in the plating in the step (6).

The photoresist 25 can allow the light in the step (4) (ref: FIG. 4F) (e.g., ultraviolet ray, etc.) to partially pass through, to be specific, the photoresist 25 has an ultraviolet ray transmissivity of, for example, 10% or more, preferably 20% or more, and for example, 60% or less, preferably 50% or less.

The above-described photoresist 25 is disposed on the entire top face of the metal thin film 33.

At that time, the dry film photoresist is pressed (pushed onto) using, for example, a flat plate. Therefore, the top face of the photoresist 25 is a flat face.

The thickness of the photoresist 25 is not particularly limited, and is, for example, 10 μm or more, and for example, 50 μm or less, preferably 30 μm or less.

2-6. Step (4)

As shown in FIG. 4F, in the step (4), the photomask 24 is disposed so that the first portion 23 in the photoresist 25 is shielded from light, thereby exposing the photoresist 25 to light through the photomask 24.

The first portion 23 is a portion that is to be shielded (should be shielded) from light in the step (4) in the photoresist 25. The first portion 23 is a portion to be removed (should be removed), as shown in FIG. 5G, in the following step (5). Furthermore, the first portion 23 is a portion, as shown in FIG. 5H, where the second wire 20 is provided at the opening 30 (described later) of the photoresist 25 in the following step (6) (charged with). To be specific, the first portion 23 is a portion where the second wire 20 and the second terminal (not shown) are provided in the opening 30 of the photoresist 25 in the following step (6) (charged with).

The photomask 24 includes a translucent portion 26 that allows light from above to pass through below, and a light shield portion 27 that allows light from above to be shielded to below.

The translucent portion 26 is a portion that does not form the second conductive pattern 6, and the light shield portion 27 is a portion where the second conductive pattern 6 is formed. The light shield portion 27 corresponds to the first portion 23.

In the step (4), the photomask 24 is disposed so that the light shield portion 27 faces the first portion 23, and the translucent portion 26 faces the portion other than the first portion 23 in the photoresist 25 when projected in the thickness direction.

The photomask 24 is disposed so that the light shield portion 27 deviates from the center C2 of virtual circle VC2 along the base arc portion 17, and overlaps with the virtual circle VC2.

The photomask 24 is disposed above and faces the photoresist 25 in spaced-apart relation. Although not shown in FIG. 4F, the photomask 24 can also be directly contacted with the top face of the photoresist 25.

In this manner, the photomask 24 is disposed so that the first portion 23 in the photoresist 25 is shielded from light. Furthermore, the photomask 24 is disposed so that the portion other than the first portion 23 in the photoresist 25 is shielded from light.

Then, in the step (4), the photoresist 25 is exposed to light through the photomask 24.

To expose the photoresist 25 to light, light is applied to the photomask 24 from the light source (not shown) disposed above the photomask 24. The wavelength of the light is, for example, 100 nm or more, preferably 350 nm or more, and for example, 800 nm or less, preferably 450 nm or less. The application (exposure) amount is, for example, 100 mJ/cm$^2$ or more, and 800 mJ/cm$^2$ or less.

[1] Then, light A applied to the light shield portion 27 of the photomask 24 is shielded with the light shield portion 27, and does not reach the first portion 23 of the photoresist 25.

[2] Meanwhile, light B applied to the translucent portion 26 of the photomask 24 passes through the translucent portion 26 and reaches the portion other than the first portion 23 of the photoresist 25.

2-7. Step (5)

As shown in FIG. 5G in the step (5), the first portion 23 (ref: FIG. 4F) in the photoresist 25 is removed.

To be specific, first, as necessary, the photoresist 25 after exposure to light is heated (heating after exposure).

Then, the photoresist 25 is developed with a developer. In this manner, the portion other than the first portion 23 in the photoresist 25 is left, and only the first portion 23 is removed. That is, in the photoresist 25, the opening 30 corresponding to the first portion 23 is formed. The opening 30 penetrates the photoresist 25 in the thickness direction.

In this manner, the metal thin film 33 corresponding to the first portion 23, that is, the metal thin film 33 facing the opening 30 is exposed.

Thereafter, as necessary, the photoresist 25 is cured by heating.

2-8. Step (6)

As shown in the phantom line of FIG. 5H, in the step (6), first, the second conductive pattern 6 is provided on the metal thin film 33 exposed from the photoresist 25.

To provide the second conductive pattern 6 on the metal thin film 33, electrolytic plating in which electricity is supplied from the metal thin film 33 is used.

At this time, the photoresist 25 is used as a plating resist. The metal thin film 33 is used as a feeding layer.

In this manner, the second conductive pattern 6 is formed as a pattern having a second wire 20 and a second terminal.

2-9. Step (iii)

As shown in FIG. 5I, in the step (iii), the photoresist 25 is removed.

To be specific, the photoresist 25 is removed, for example, by wet etching.

2-10. Step (iv)

As shown in FIG. 6J, in the step (iv), the metal thin film 33 corresponding to the photoresist 25 (ref: FIG. 5H) is removed.

To be specific, the metal thin film 33 positioned below the photoresist 25 is removed, for example, by peeling.

2-11. Step (v)

As shown in FIG. 6K, in the step (v), the insulating cover layer 7 is provided in a pattern such that in the second conductive pattern 6, the second wire 20 is covered and the second terminal (not shown) is exposed.

The wired circuit board 1 including the insulating base layer 3, the first conductive pattern 4, the intermediate insulating layer 5, the metal thin film 33, second conductive pattern 6, and the insulating cover layer 7 is produced in this manner.

In the wired circuit board 1, the metal thin film 33 can be integrated with the second conductive pattern 6, to be specific, the metal thin film 33 can be incorporated as a part of the second conductive pattern 6. At that time, as shown in FIG. 1, there may be a case where the metal thin film 33 cannot be distinguished with the second conductive pattern 6 clearly.

Use of such a wired circuit board 1 is not particularly limited, and for example, it is used as various wired circuit boards: a suspension board with circuit included in a hard disk drive and including the metal supporting board 2 (ref: phantom line in FIG. 2), and a flexible wired circuit board not including the metal supporting board 2 and having flexibility. In particular, the wired circuit board 1 is suitably used in a suspension board with circuit that requires a high density wire (conductive pattern), and is a suspension board with circuit having the first arc portion 11 in the heat mounting region.

Figure 9B:
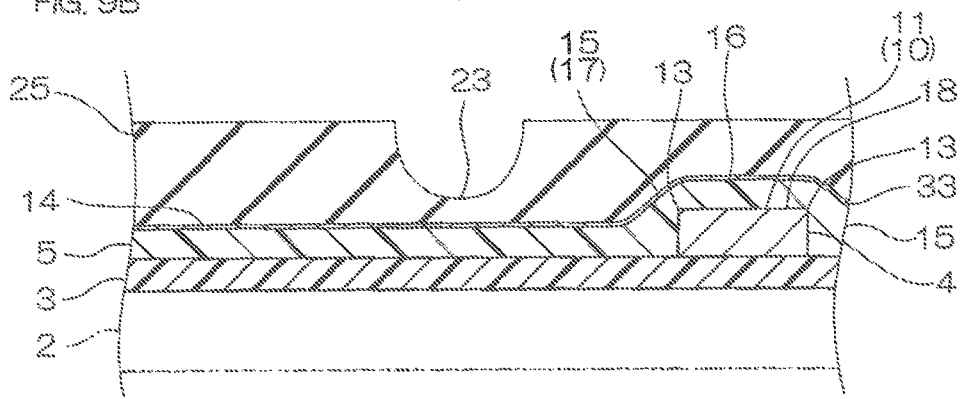

As shown in FIG. 7 and FIG. 8, even when producing the wired circuit board 1 with which the second wire 20 overlaps with the center C2 of the virtual circle VC2 along the base arc portion 17 when viewed from the top, as shown in FIG. 9A and FIG. 9B, the step (4) and the step (5) are conducted.

In the wired circuit board 1, the second wire 20 overlaps with the center C2 of the virtual circle VC2 along the base arc portion 17 when viewed from the top.

[1] As shown in FIG. 9A, in the step (4), the portion of the light B passes through the translucent portion 26, and reaches the metal thin film 33 corresponding to the base arc portion 17. Then, the light B reflects at the top face of the metal thin film 33 corresponding to the base arc portion 17 to produce the reflected light B'. The reflected light B' passes through the photoresist 25 obliquely and upwardly toward one side in the width direction when viewed in cross section, and reaches the first portion 23 of the photoresist 25.

[2] At the same time, as shown in FIG. 7, the reflected light B' is focused toward the first portion 23 overlapped with the center C2 of the arc VC2 along the base arc portion 17 from the metal thin film 33 corresponding to the base arc portion 17 when viewed from the top. That is, when viewed from the top, the metal thin film 33 corresponding to the base arc portion 17 works as a concave lens, and the reflected light B' is focused on the first portion 23, that is, on the point of the center C2 (center C1 of the virtual circle VC1 along the first arc portion 11) of the virtual circle VC2 along the base arc portion 17. Therefore, the amount of light at the first portion 23 is relatively high. To be specific, the amount of light at the first portion 23 is the amount of light that allows the first portion 23 to remain in the step (5) shown in FIG. 9B, or even more.

Figure 9C:
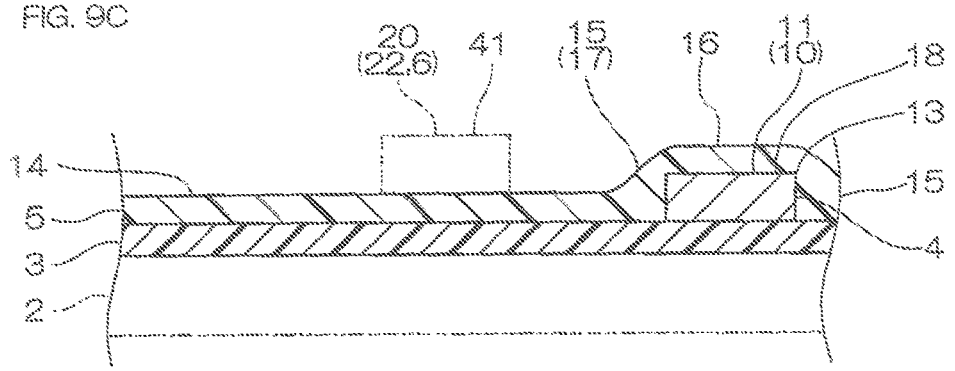

[3] Then, as shown in FIG. 9B, in the step (5), the metal thin film 33 corresponding to the first portion 23 cannot be exposed, and as shown in FIG. 9C, in the step (6), the second conductive pattern 6 cannot be provided suitably. That is, the reflected light B' corresponding to the base arc portion 17 is focused on the first portion 23 of the photoresist 25, thereby causing deformation of the second wire 20.

However, with the method, as shown in FIG. 4F, in the step (4), the light shield portion 27 of the photomask 24 is disposed so as to deviate from the center C2 of the virtual circle VC2 along the base arc portion 17, and therefore, as shown in FIG. 1, even if the reflected light B' reflected at the metal thin film 33 corresponding to the base arc portion 17 is focused on the center C1 of the photoresist 25, light focusing on the first portion 23, where the second conductive pattern 6 is to be provided (should be provided) in the photoresist 25, can be avoided (suppressed).

Therefore, as shown in FIG. 5G, in the step (5), the first portion 23 in the photoresist 25 can be reliably removed. Therefore, the metal thin film 33 corresponding to the first portion 23 can be exposed, and then, as shown in FIG. 5H, in the step (6), the second conductive pattern 6 having the second wire 20 with suppressed deformation can be provided.

As a result, the wired circuit board 1 with excellent connection reliability can be produced.

Furthermore, in this method, as shown in FIG. 1, the second wire 20 does not pass through the center C2 of the virtual circle VC2 along the base arc portion 17, but passes through the virtual circle VC2 along the base arc portion 17, and therefore, the second conductive pattern 6 including the second wire 20 can be provided with a high density.

Furthermore, in this method, as shown in FIG. 6J, in the step (6), the second conductive pattern 6 and the first conductive pattern 4 are provided above and below the intermediate insulating layer 5, and therefore, the second conductive pattern 6 and the first conductive pattern 4 can be electrically insulated with the intermediate insulating layer 5.

Second Embodiment

In the second embodiment, for the members and steps that are the same as the first embodiment, the same reference numerals are given and detailed descriptions thereof are omitted.

In the first embodiment, the negative type photoresist 25 is used, and the additive method is used to form the second conductive pattern 6.

However, in the second embodiment, the positive type photoresist 25 is used, and the subtractive method is used to form the second conductive pattern 6.

3-1. Method for Producing a Wired Circuit Board

The production method of the wired circuit board 1 in the second embodiment includes a step (i) (ref: FIG. 3A), in which the insulating base layer 3 of the first embodiment is prepared, a step (ii) (ref: FIG. 3B), in which the first conductive pattern 4 is provided, and a step (1) (ref: FIG. 3C), in which the intermediate insulating layer 5 is provided.

Figure 10A:
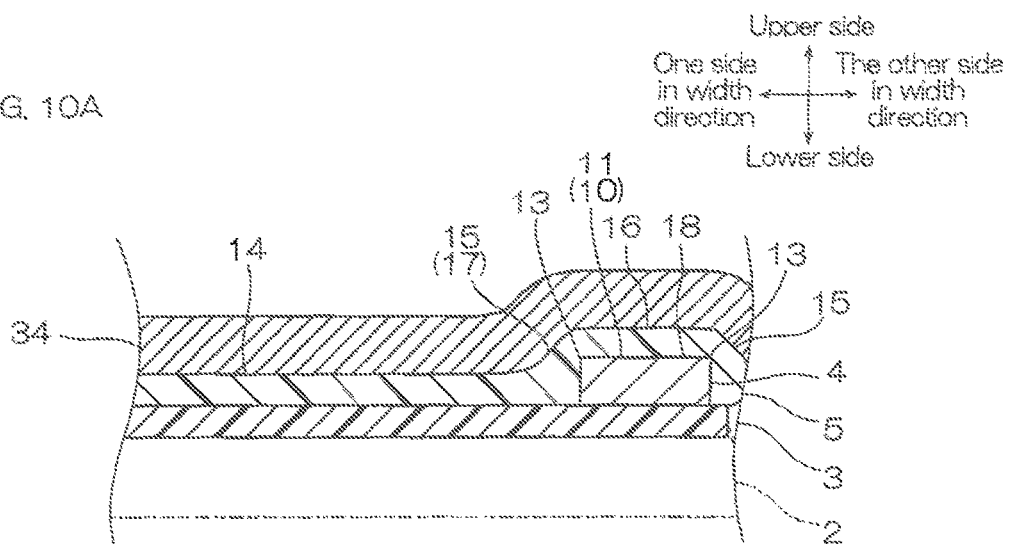
FIG. 10A to FIG. 10C are process diagrams illustrating a second embodiment of the method for producing a wired circuit board of the present invention, FIG. 10A illustrating a step (2), in which the conductive layer is provided, FIG. 10B illustrating a step (3), in which the photoresist is provided, the photomask is disposed, and the photoresist is exposed to light, and FIG. 10C illustrating a step (4), in which the portion other than the first portion in the photoresist is removed.
Figure 10B:
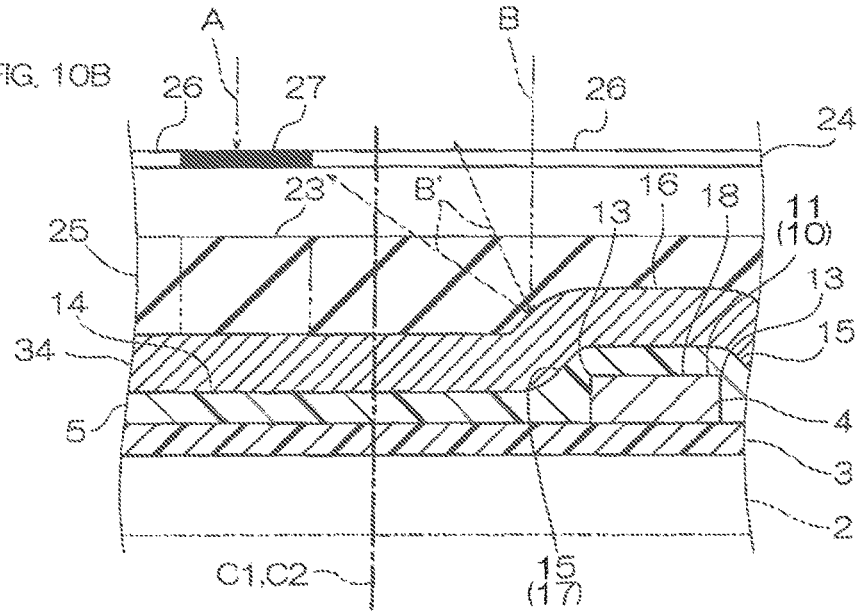

The production method of the wired circuit board 1 of the second embodiment further includes a step (2) (ref: FIG. 10A), in which the conductive layer 34 is provided at least on the inclination face 15 of the intermediate insulating layer 5, a step (3) (ref: FIG. 10B), in which the photoresist 25 is provided on the conductive layer 34, and a step (4) (ref: arrow in FIG. 10B), in which the photomask 24 is disposed so that the first portion 23 of the photoresist 25 is shielded from light, and the photoresist 25 is exposed to light through the photomask 24.

Figure 10C:
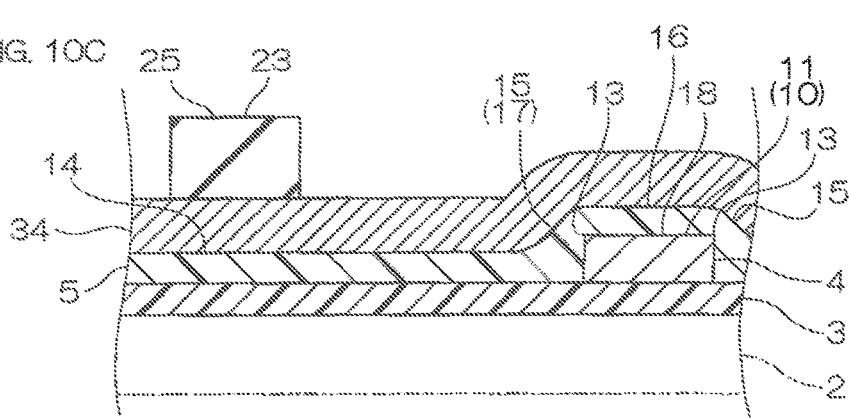

Furthermore, the production method of the wired circuit board 1 of the second embodiment includes a step (5) (ref: FIG. 10C), in which the portion other than the first portion 23 is removed so as to leave the first portion 23 in the photoresist 25, and a step (6) (ref: phantom line in FIG. 11D), in which the conductive layer 34 exposed from the photoresist 25 is removed to form the second conductive pattern 6.

Furthermore, the production method of the wired circuit board 1 includes a step (iii) (ref: FIG. 11E), in which the photoresist 25 is removed, and a step (v) (ref: FIG. 11F), in which the insulating cover layer 7 is provided.

3-2. Step (1) and Step (2)

In the second embodiment, as shown in FIG. 10A and FIG. 10B, the step (1) and the step (2) are sequentially conducted. Alternatively, the step (1) and the step (2) are conducted, for example, simultaneously. In such a case, the two-layer substrate in which the intermediate insulating layer 5 and the conductive layer 34 are laminated is provided on the insulating base layer 3 so as to cover the first conductive pattern 4.

The conductive layer 34 is disposed on the entire top face including the first flat face 14, the inclination face 15, and the second flat face 16 of the intermediate insulating layer 5. The conductive layer 34 extends along the top face of the intermediate insulating layer 5 along the surface direction. The conductive layer 34 is made of the same conductive material as that of the second conductive pattern 6. The thickness of the conductive layer 34 is the same as the thickness of the second conductive pattern 6.

3-3. Step (4)

As shown in FIG. 10B, in the step (4), the photomask 24 is disposed so that the first portion 23 is shielded from light in the photoresist 25.

The photoresist 25 is a positive type photoresist (positive photoresist). The positive type photoresist is a resist that allows the portion to which a predetermined amount or more of light is exposed at the time of exposure to be removed in developing thereafter, and meanwhile, the portion which is shielded from light at the time of exposure (portion to which light of a predetermined amount of light or more is not applied, that is, portion to which light of less than the predetermined amount of light is allowed) to remain in developing thereafter.

Thereafter, as shown in the arrow in FIG. 10B, the photoresist 25 is exposed to light through the photomask 24.

[1] Then, the light A applied to the light shield portion 27 of the photomask 24 is shielded with the light shield portion 27 and does not reach the first portion 23.

[2] Meanwhile, the light B applied to the translucent portion 26 of the photomask 24 passes through the translucent portion 26, and reaches the portion other than the first portion 23 in the photoresist 25. Then, the light B reaches the conductive layer 34 facing the base arc portion 17.

3-4. Step (5)

As shown in FIG. 10C, in the step (5), the photoresist 25 after exposure to light is developed with, for example, a developer, and the photoresist 25 other than the first portion 23 is removed so as to leave the first portion 23.

3-5. Step (6)

Figure 11D:
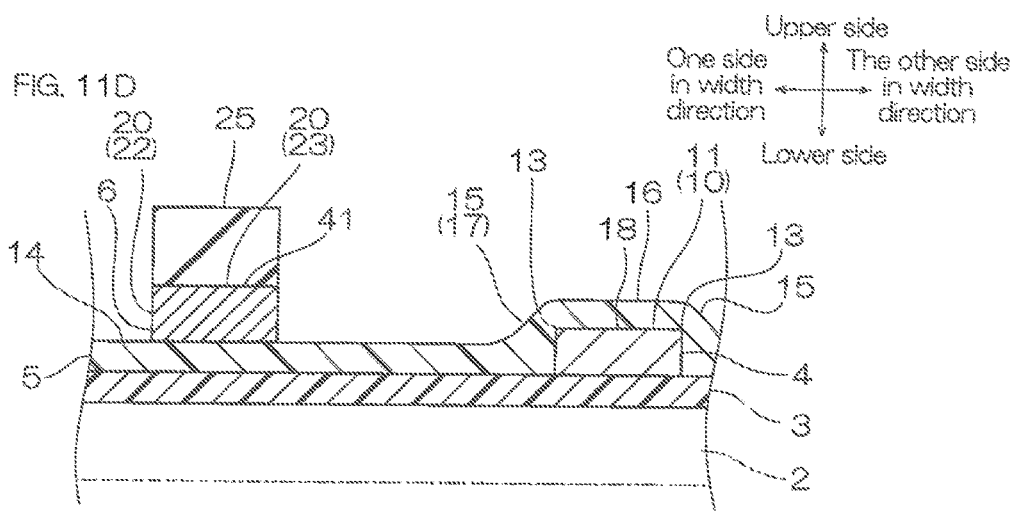
FIG. 11D to FIG. 11F show, following FIG. 10C, process diagrams illustrating the second embodiment of the method for producing a wired circuit board of the present invention.
Figure 11E:
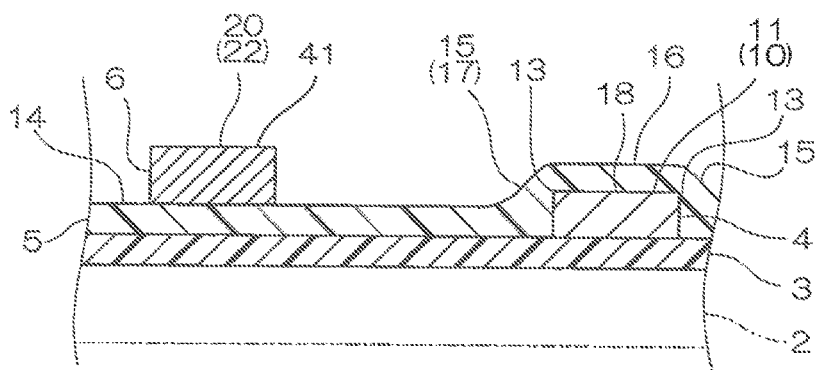
Figure 11F:
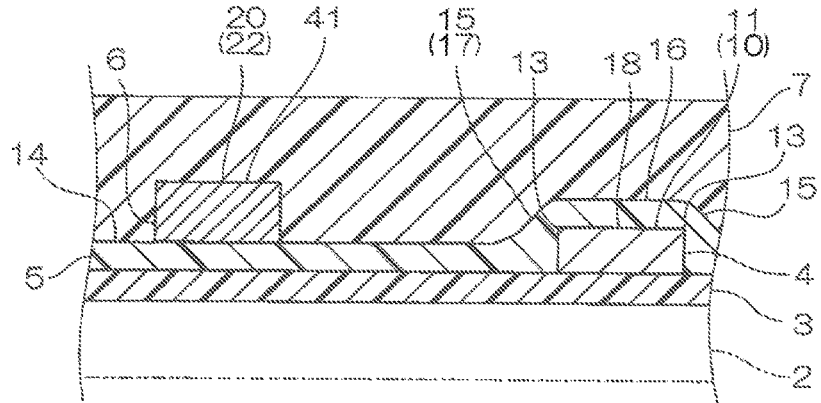

As shown in FIG. 11D, in the step (6), the conductive layer 34 exposed from the photoresist 25 is removed.

For example, the photoresist 25 is used as an etching resist to conduct etching on the conductive layer 34.

In this manner, the second conductive pattern 6 having the second wire 20 and the second terminal (not shown) is formed.

3-6. Step (iii)

As shown in FIG. 11E, in the step (iii), the photoresist 25 is removed, for example, by peeling.

4. Wired Circuit Board

The wired circuit board 1 produced by the above-described production method includes the insulating base layer 3, the first conductive pattern 4, the intermediate insulating layer 5, the second conductive pattern 6, and the insulating cover layer 7 covering the second conductive pattern 6. The wired circuit board 1 in the second embodiment does not include the metal thin film 33 (ref: FIG. 2) unlike the first embodiment.

Meanwhile, the wired circuit board 1 in the second embodiment may include an adhesive layer (not shown) between the second conductive pattern 6 and the intermediate insulating layer 5 so as to allow them to adhere.

However, even if the second wire 20 shown in FIG. 7 and FIG. 8 is formed with the second conductive pattern 6 overlapping with the center C1 of the virtual circle VC1 along with the first arc portion 11 when viewed from the top by the subtractive method using the positive type photoresist 25, as shown in FIG. 12A to FIG. 12C, the step (4) and the step (5) are conducted.

[1] As shown in FIG. 12A, in the step (4), the portion of the light B reaches the conductive layer 34 corresponding to the base arc portion 17 passing through the translucent portion 26. Then, the light B reflects at the top face of the conductive layer 34 corresponding to the base arc portion 17 to produce the reflected light B'. The reflected light B' passes through the photoresist 25 upwardly and obliquely toward one side in the width direction when viewed in cross section, and reaches the first portion 23 of the photoresist 25.

[2] At the same time, as shown in FIG. 7, the reflected light B' is focused on the first portion 23 overlapped with the C2 of the virtual circle VC2 along the base arc portion 17 from the conductive layer 34 corresponding to the base arc portion 17 when viewed from the top. That is, when viewed from the top, the conductive layer 34 corresponding to the base arc portion 17 acts as a concave lens, and the reflected light B' is focused on the point of the first portion 23, that is, the center C2 of the virtual circle VC2 along the base arc portion 17 (center C1 of the virtual circle VC1 along the first arc portion 11). Therefore, the amount of light on the first portion 23 is relatively high. To be specific, the amount of light on the first portion 23 is the amount of light that allows at least a portion of the first portion 23 to be removed in the step (5) shown in FIG. 12A, or even more.

[3] Then, as shown in FIG. 12B, in the step (5), at least a portion of the first portion 23 is removed, and therefore, as shown in FIG. 12C, the conductive layer 34 corresponding to the first portion 23 cannot be formed into a predetermined shape, that is, deformation of the second conductive pattern 6 is caused.

However, with the production method, as shown in FIG. 10B, in the step (4), the light shield portion 27 of the photomask 24 is disposed so as to deviate from the center C2 of the virtual circle VC2 along the base arc portion 17, and therefore, even if the reflected light B' reflected at the metal thin film 33 corresponding to the base arc portion 17 is focused on the center C1 in the photoresist 25, light focusing on the first portion 23, where the conductive pattern is to be provided in the photoresist 25, can be avoided (suppressed).

Therefore, as shown in FIG. 10C, in the step (5), the first portion 23 in the photoresist 25 can be reliably left, and therefore, the conductive layer 34 corresponding to the first portion 23 can be left. Therefore, as shown in FIG. 11D, in the step (6), the second conductive pattern 6 having the second wire 20 with which deformation is suppressed can be provided.

As a result, the wired circuit board 1 with excellent connection reliability can be produced.

Third Embodiment

In the third embodiment, for the members and steps that are the same as the first and second embodiments, the same reference numerals are given and detailed descriptions thereof are omitted.

As shown in FIG. 1 and FIG. 2, in the wired circuit board 1 of the first embodiment, the second wire 20 crosses the first linear portion 12.

Figure 13:
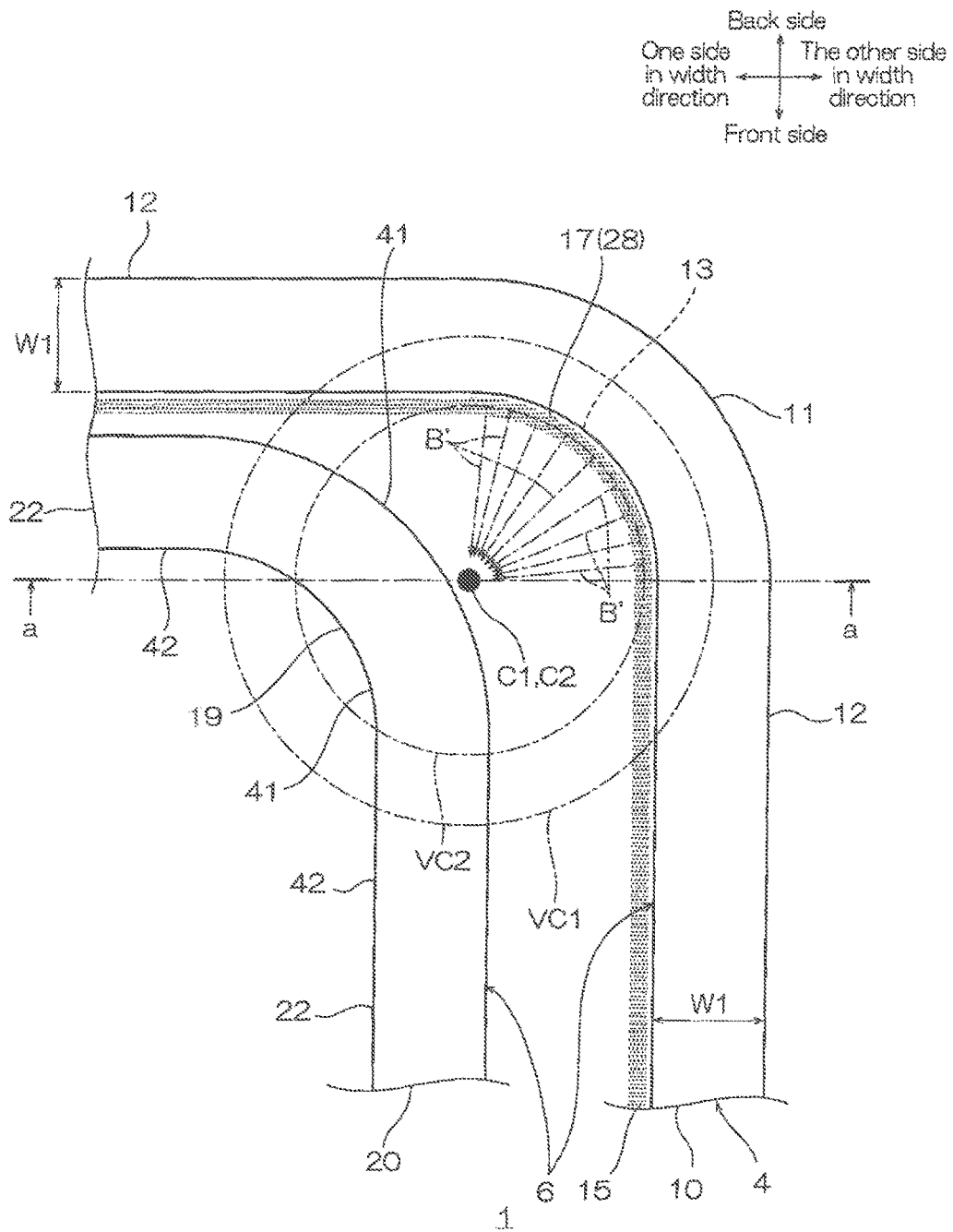
FIG. 13 shows a plan view of the wired circuit board in a third embodiment of the present invention.

However, as shown in FIG. 13, in the third embodiment, the second wire 20 has an L-shaped portion that does not cross the first linear portion 12. That is, the second wire 20 is disposed at the inner side of the first wire 10 in spaced-apart relation when viewed from the top.

The second wire 20 integrally includes a curve portion 19 and two second linear portions 22 that are connected to both ends thereof.

The curve portion 19 is an inner side portion 41 as an example of the inner circle portion positioned at an inner side of the virtual circle VC2 along the first arc portion 11. The curve portion 19 is bent in one side in the width direction as it approaches to the back side.

The two second linear portions 22 are disposed so that their extension lines cross (to be specific, cross at right angles). The two second linear portions 22 are parallel to the two first linear portions 12.

The third embodiment also achieves the same operations and effects as those of the first embodiment.

Fourth Embodiment

In the fourth embodiment, for the members and steps that are the same as the first to third embodiments, the same reference numerals are given and detailed descriptions thereof are omitted.

Figure 14:
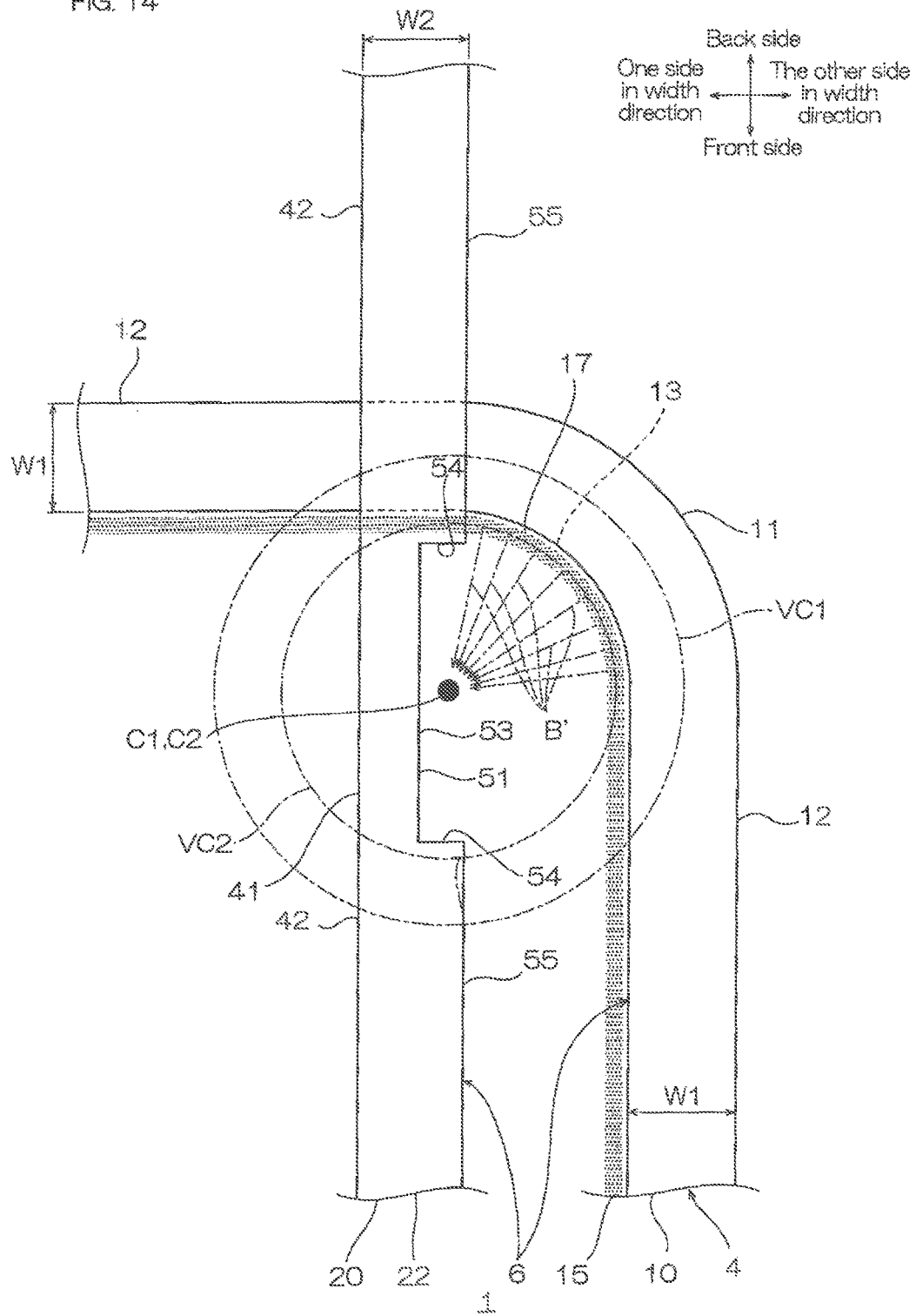
FIG. 14 shows a plan view of the wired circuit board in a fourth embodiment of the present invention.

As shown in FIG. 14, in the fourth embodiment, the second wire 20 has a cutout 51.

The cutout 51 is positioned at a right side portion of the second linear portion 22 at a point in front-back direction. The cutout 51 has a shape that is formed by cutting the right side portion of the second linear portion 22 into a generally rectangular shape when viewed from the top. The cutout 51 is formed from a first inner side face 53 facing the cutout 51 in the other side in the width direction and two second inner side faces 54 extending from both end portions in the front-back direction of the first inner side face 53 to the other side in the width direction.

The cutout 51 is overlapped with the center C2 of the virtual circle VC2 along the base arc portion 17 when viewed from the top. When projected in the front-back direction, the center C2 of the virtual circle VC2 (center C1 of the virtual circle VC1 along the first arc portion 11) along the base arc portion 17 is positioned between the first inner side face 53 and the other end face in the width direction 55 of the second linear portion 22 at both sides of the cutout 51 in the front-back direction. The center C2 of the virtual circle VC2 (center C1 of the virtual circle VC1 of the first arc portion 11) along the base arc portion 17 is positioned between the two second inner side faces 54.

With the fourth embodiment, with a simple configuration in which the cutout 51 is provided in the second wire 20, light focusing on the photomask 24 can be avoided.

Fifth Embodiment

In the fifth embodiment, for the members and steps that are the same as the first to fourth embodiments, the same reference numerals are given and detailed descriptions thereof are omitted.

Figure 15:
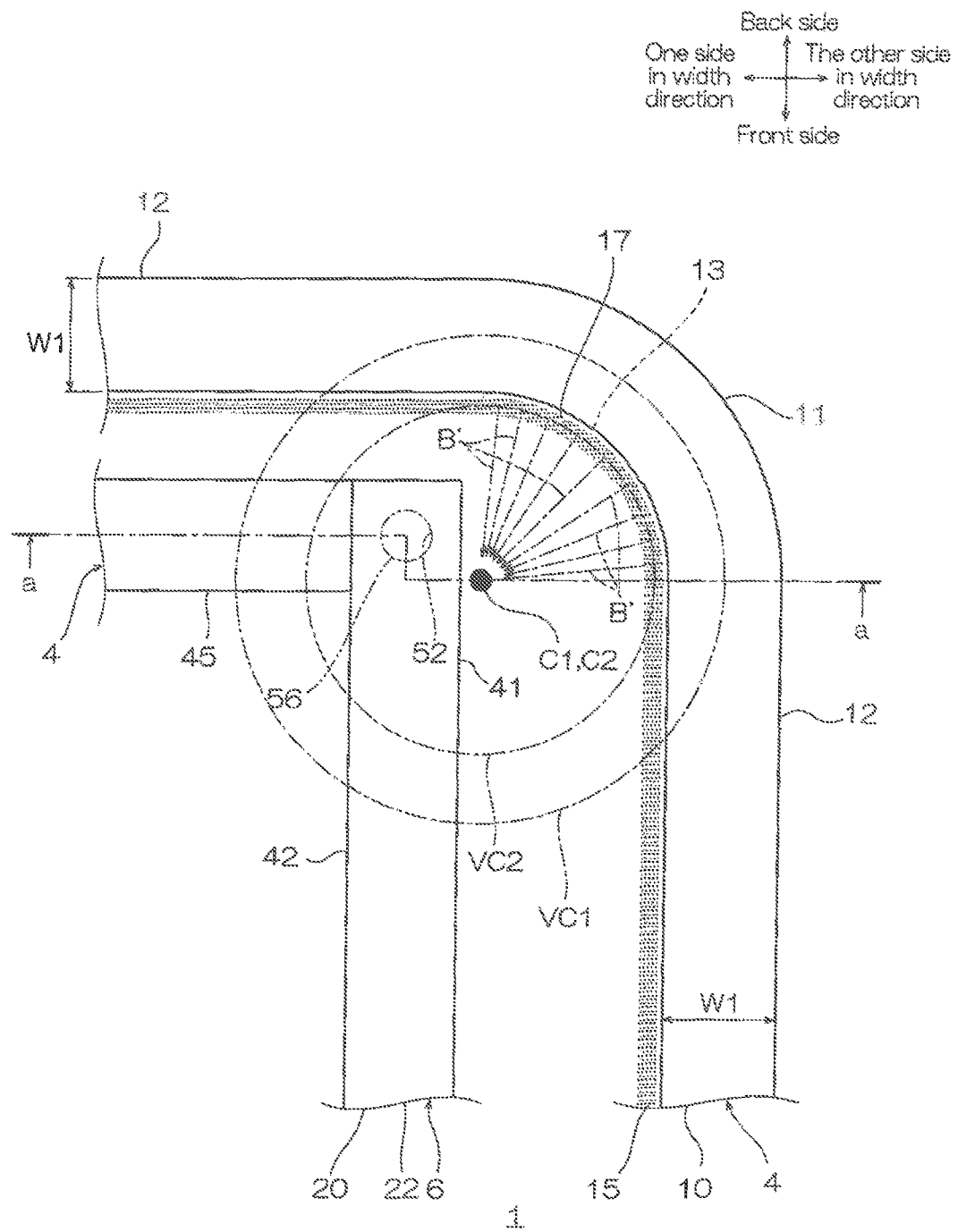
FIG. 15 shows a plan view of the wired circuit board in a fifth embodiment of the present invention.
Figure 16:
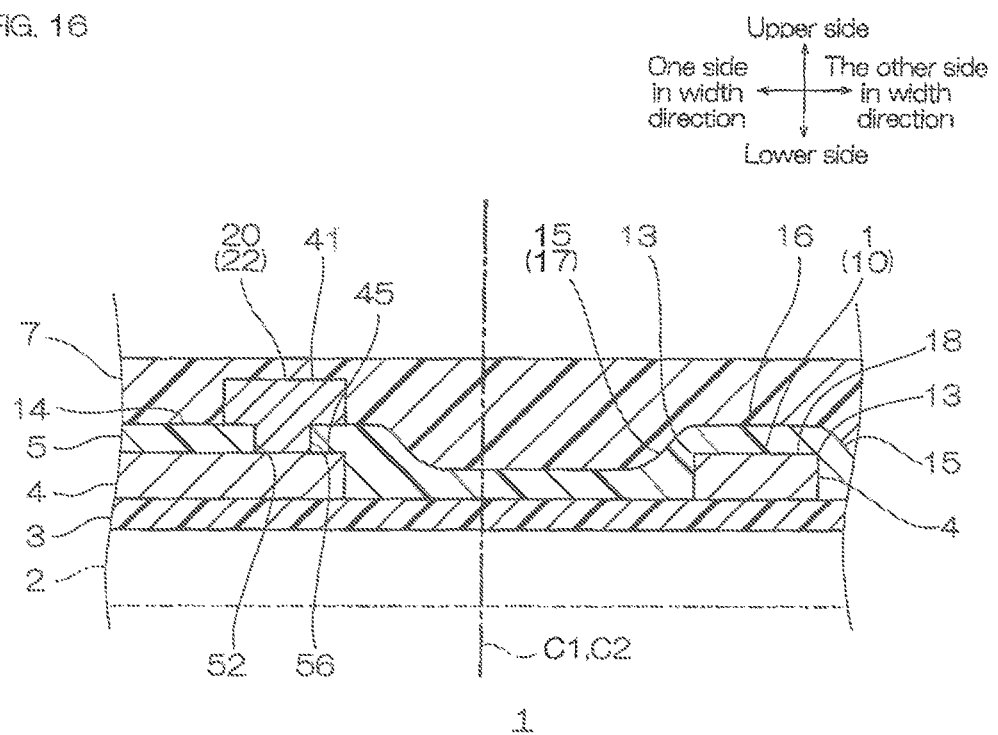
FIG. 16 shows a cross-sectional view along line a-a of the wired circuit board shown in FIG. 15.

In the fifth embodiment, as shown in FIG. 15 and FIG. 16, the first conductive pattern 4 further includes a third wire 45. That is, the first conductive pattern 4 includes the first wire 10 and the third wire 45.

The third wire 45 is provided independently from the first wire 10. The third wire 45 is disposed in spaced-apart relation with the first wire 10. To be specific, it is disposed in spaced-apart relation at the front side of the first linear portion 12 extending in the width direction. The third wire 45 has a generally linear shape extending in the width direction. Meanwhile, the third wire 45 partially overlaps with the second wire 20 of the second conductive pattern 6 when viewed from the top. To be specific, when viewed from the top, the other end portion in the width direction of the third wire 45 overlaps with the back end portion of the second wire 20.

In the second wire 20, the back end portion of the second linear portion 22 is the inner side portion 41, and is disposed in the virtual circle VC2 along the base arc portion 17 when viewed from the top. The inner side portion 41 does not overlap with and deviates from the center C2 of the virtual circle VC2 along the base arc portion 17 when viewed from the top.

At the back end portion of the second wire 20, a conductive portion 56 is provided. The conductive portion 56 fills a middle through hole 52 provided in the intermediate insulating layer 5. The conductive portion 56 has a generally circular shape when viewed from the top. The lower end portion of the conductive portion 56 is directly in contact with the top face of the other end portion in the width direction of the third wire 45. The second wire 20 and the third wire 45 are electrically connected with the conductive portion 56. The second wire 20 and the third wire 45 have a generally L-shape when viewed from the top. That is, the second wire 20 and the third wire 45 have a generally L-shaped electrical path when viewed from the top.

The inner side portion 41 includes the back end portion of the second wire 20.

The wired circuit board 1 in the fifth embodiment can be produced with any of the negative type photoresist 25 and the positive type photoresist 25.

The fifth embodiment also achieves the same operations and effects as those of the first embodiment.

Sixth Embodiment

In the sixth embodiment, for the members and steps that are the same as the first to fifth embodiments, the same reference numerals are given and detailed descriptions thereof are omitted.

Figure 17:
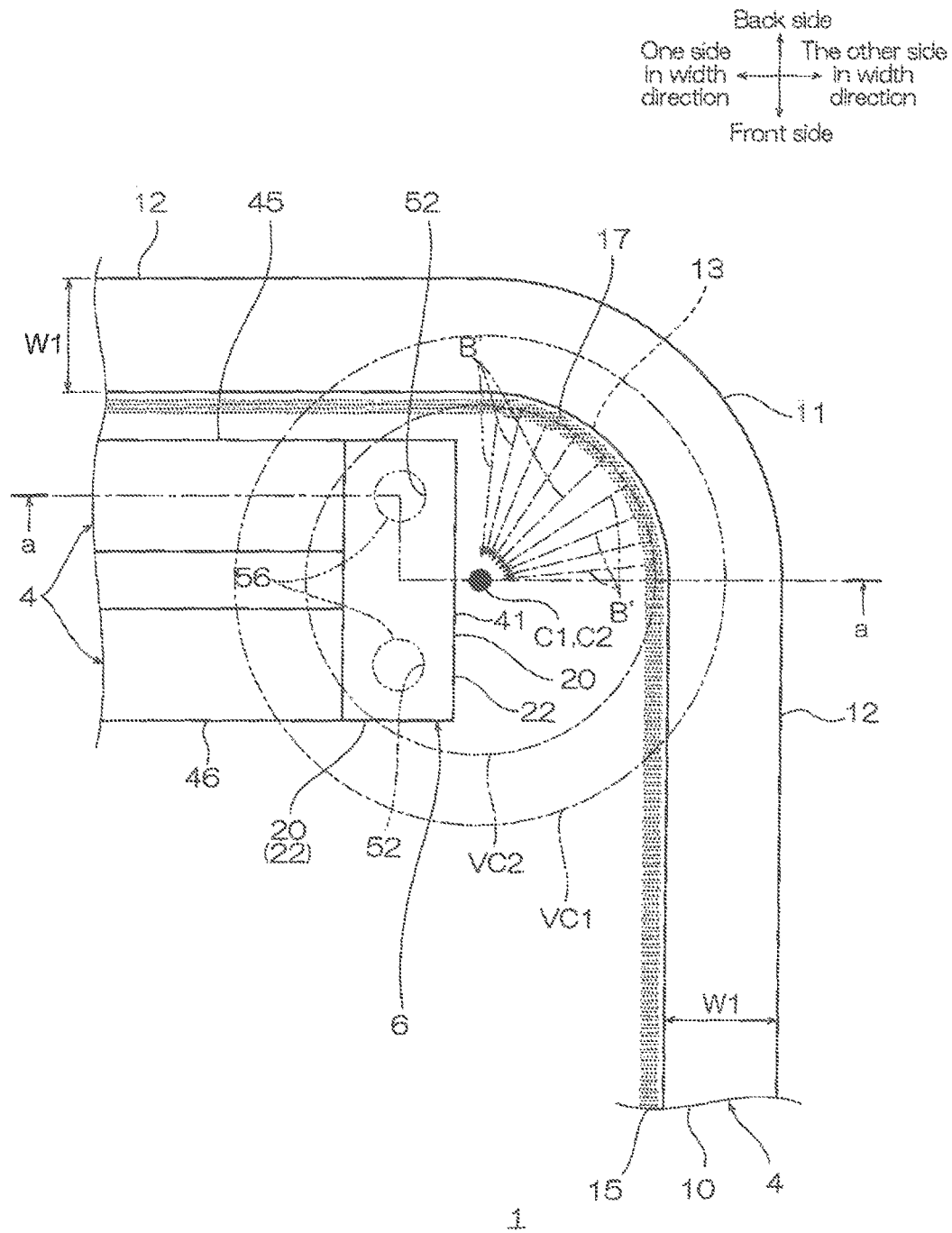
FIG. 17 shows a plan view of the wired circuit board in a sixth embodiment of the present invention.

In the sixth embodiment, as shown in FIG. 17, the first conductive pattern 4 further includes a fourth wire 46. That is, the second conductive pattern 6 includes the first wire 10, the third wire 45, and the fourth wire 46.

The fourth wire 46 is provided independently from the first wire 10 and the third wire 45. The fourth wire 46 parallels with the third wire 45. The fourth wire 46 is disposed at the front side of the third wire 45 in spaced-apart relation. The fourth wire 46 has the same configuration with the third wire 45.

The second linear portion 22 in the second wire 20 is the inner side portion 41 positioned at the inner side portion of the virtual circle VC2 along the base arc portion 17 when viewed from the top. The inner side portion 41 does not overlap with and deviates from the center C2 of the virtual circle VC2 along the base arc portion 17 when viewed from the top. The second linear portion 22 has a generally linear shape extending in the front-back direction. The second wire 20 has the conductive portion 56 at front-back both end portions.

The second wire 20, the third wire 45, and the fourth wire 46 have a generally U-shape opening in one side in the width direction when viewed from the top. That is, the second wire 20, the third wire 45, and the fourth wire 46 form a generally U-shaped electrical path when viewed from the top.

The wired circuit board 1 in the sixth embodiment can be produced by using any of the negative type photoresist 25 and the positive type photoresist 25.

The sixth embodiment also achieves the same operations and effects as those of the first embodiment.

Seventh Embodiment

In the seventh embodiment, for the members and steps that are the same as the first to sixth embodiments, the same reference numerals are given and detailed descriptions thereof are omitted.

Figure 18:
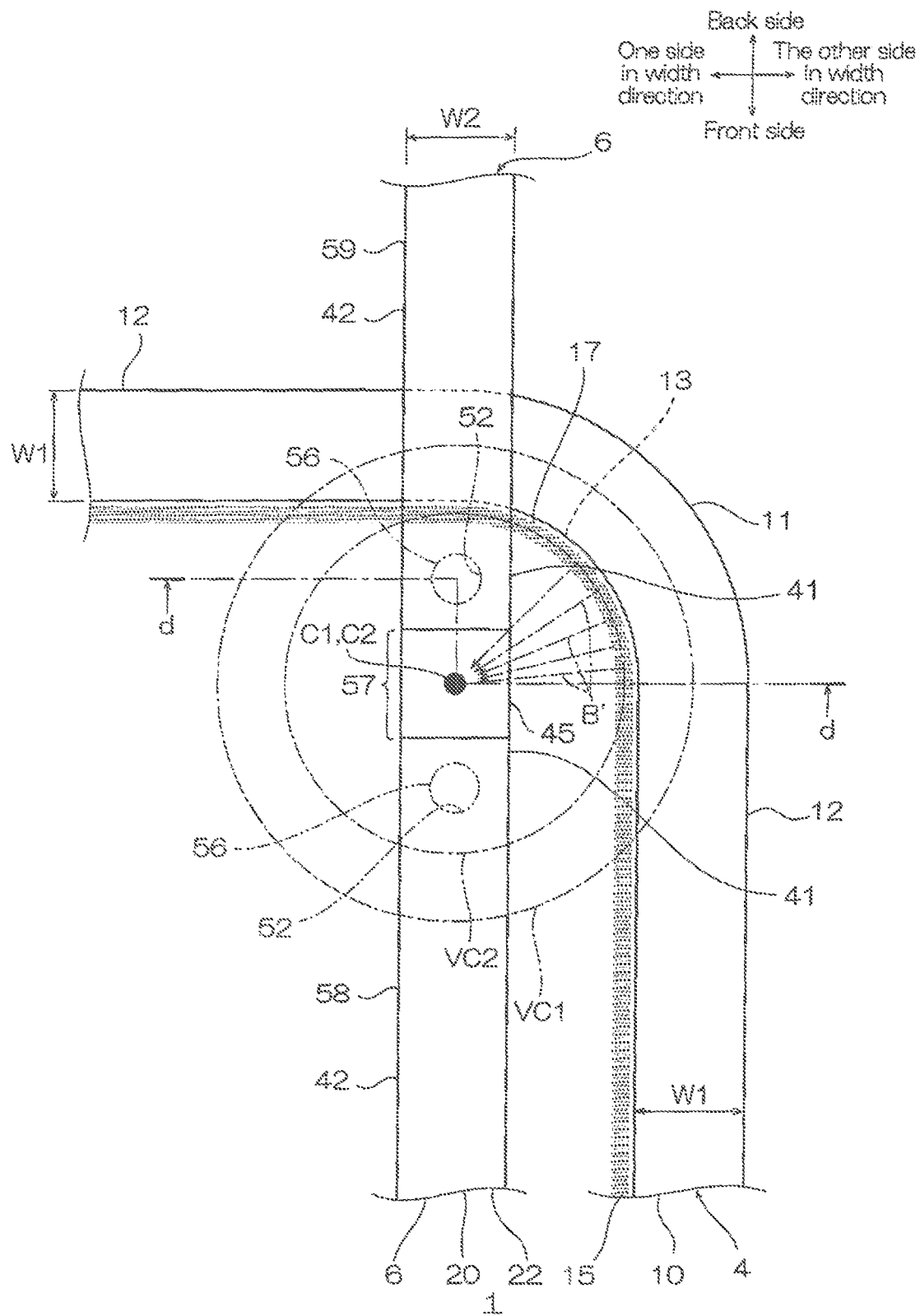
FIG. 18 shows a plan view of the wired circuit board in a seventh embodiment of the present invention.
Figure 19:
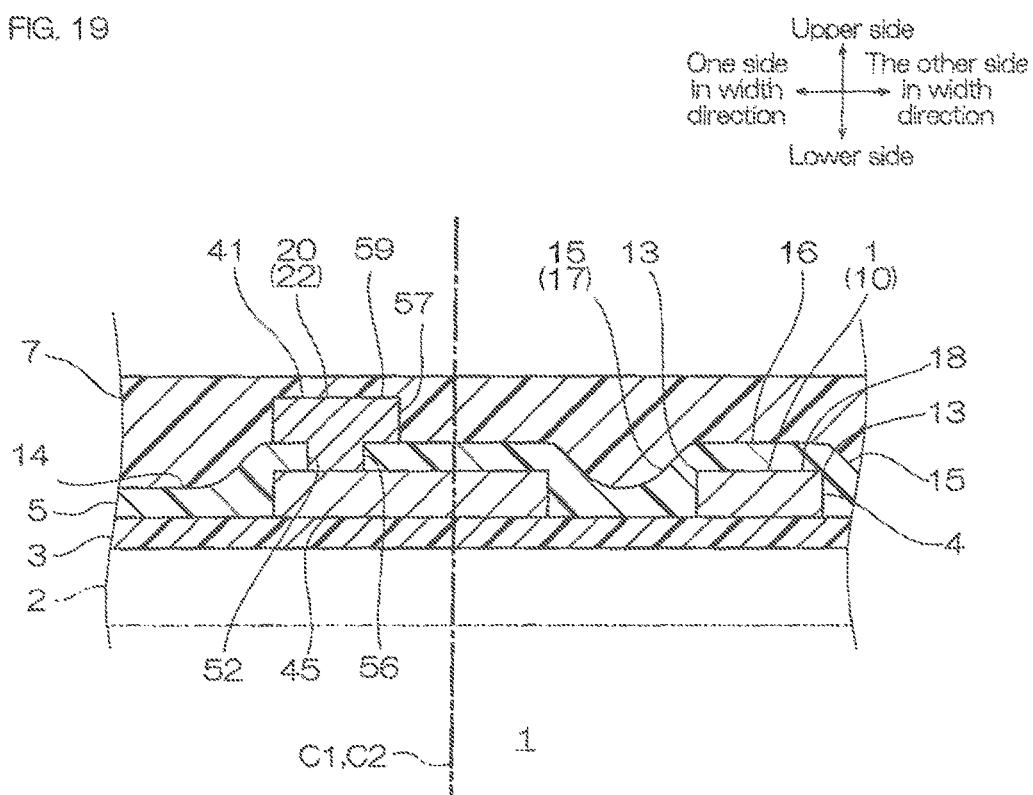
FIG. 19 shows a cross-sectional view along line a-a of the wired circuit board shown in FIG. 18.

In the seventh embodiment, as shown in FIG. 18 and FIG. 19, in the first conductive pattern 4, the second wire 20 has a gap 57 that divides in the front-back direction. To be specific, the second wire 20 is divided into two in the front-back direction. To be specific, the second wire 20 has a fifth wire 58 positioned in front of the gap 57, and a sixth wire 59 positioned behind the gap 57 independently from each other.

At the back end portion of the fifth wire 58, and the front end portion of the sixth wire 59, the conductive portion 56 is provided.

The gap 57 overlaps with the center C2 of the virtual circle VC2 (center C1 of the virtual circle VC1 along the first arc portion 11) along the base arc portion 17.

The third wire 45 is disposed at the fifth wire 58 so as to connect the fifth wire 58 and the sixth wire 59 when viewed from the top. The third wire 45 has a generally linear shape extending in the front-back direction. The third wire 45 crosses over the gap 57 when viewed from the top, and connects the back end portion of the fifth wire 58, and the front end portion of the sixth wire 59. The top face of the both back-front end portions of the third wire 45 is in contact with the lower end portion of the two conductive portions 56. The third wire 45 is the inner side portion 41.

The second wire 20 (fifth wire 58, sixth wire 59) and the third wire 45 have a generally linear shape when viewed from the top. That is, the second wire 20 (fifth wire 58, sixth wire 59) and the third wire 45 have an electrical path of a generally linear shape when viewed from the top.

The wired circuit board 1 of the seventh embodiment can be produced by using any of the negative type photoresist 25 and the positive type photoresist 25.

The seventh embodiment also achieves the same operations and effects as those of the first embodiment.

Modified Example of First to Seventh Embodiments

The inclination face 15 of the intermediate insulating layer 5 of the first to seventh embodiments is in correspondence with the ridgeline portion 13 of the first conductive pattern 4.

However, for example, as shown in FIG. 20, it is also possible to simply allow the insulating base layer 3 as an example of the insulating layer to have a plurality of thicknesses T1 and T2, so that the insulating base layer 3 has the inclination face 15 without allowing the inclination face 15 to correspond to the first conductive pattern 4. The thickness T1 is the thickness of the insulating base layer 3 at the first flat face 14. The thickness T2 is the thickness of the insulating base layer 3 at the second flat face 16.

The wired circuit board 1 includes the insulating base layer 3, the first conductive pattern 4 provided on the insulating base layer 3 as an example of the conductive pattern, and the insulating cover layer 7 provided on the insulating base layer 3 so as to cover the first conductive pattern 4.

Meanwhile, the wired circuit board 1 does not include the intermediate insulating layer 5 and the second conductive pattern 6.

The modified example also achieves the same operations and effects as those of the first to seventh embodiments.

Although the wired circuit board 1 is given as an example of the wired circuit board of the present invention, it is not limited thereto, and a suspension board with circuit including the metal supporting board 2 can also be used. In such a case, the suspension board with circuit includes the metal supporting board 2, the insulating base layer 3, the first conductive pattern 4, the intermediate insulating layer 5, the second conductive pattern 6, and the insulating cover layer 7.

The intermediate insulating layer 5 has the second flat face 16, but at least the inclination face 15 will suffice, and the second flat face 16 does not have to be included.

Eighth Embodiment

In the eighth embodiment, for the members and steps that are the same as the first to seventh embodiments, the same reference numerals are given and detailed descriptions thereof are omitted.

Figure 22A:
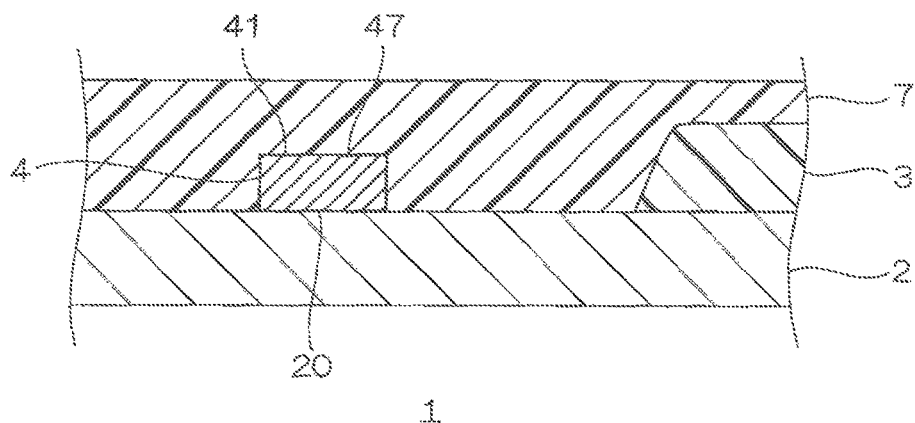
FIG. 22A and FIG. 22B are cross-sectional views of the wired circuit board shown in FIG. 21.
Figure 22B:
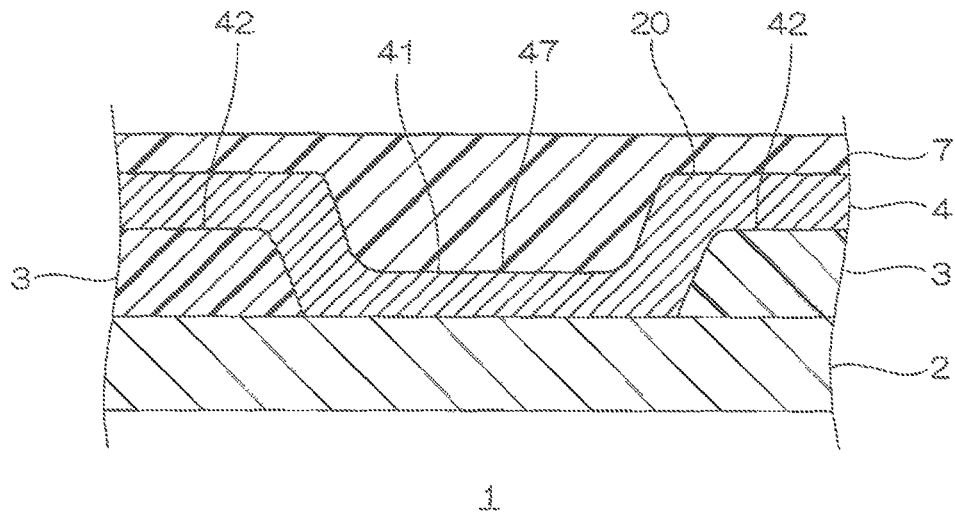

As shown in FIG. 21, FIG. 22A, and FIG. 22B, the wired circuit board 1 includes the metal supporting board 2, the insulating base layer 3, the first conductive pattern 4, and the insulating cover layer 7.

The insulating base layer 3 has a base opening 60. The base opening 60 penetrates the insulating base layer 3 in the thickness direction. The base opening 60 has a shape that extends from one side to the other side in the width direction. The distal end edge of the base opening 60 forms the base arc portion 17. The insulating base layer 3 can have a thickness that is larger than the thickness of the insulating base layer 3 in the first embodiment. To be specific, as shown in FIG. 24D, the thickness allows the reflected light B' at the metal thin film 33 corresponding to the base arc portion 17 to be headed obliquely downward, and to be headed to the center C2 of the virtual circle VC2 (center C1 of the virtual circle VC1 along the first arc portion 11) along the base arc portion 17, and is, for example, 1 μm or more, preferably 3 μm or more, and for example, 30 μm or less, preferably 25 μm or less.

The first conductive pattern 4 has the second wire 20 extending in the front-back direction. The second wire 20 has a ground portion 47 that is directly in contact with the metal supporting board 2 exposed from the base opening 60 in the middle in the front-back direction. The ground portion 47 ensures electric connection between the second wire 20 formed on the insulating base layer 3 and the metal supporting board 2. Alternatively, the ground portion 47 serves as a layer to suppress partial plating at the time of electrolytic plating by directly contacting the metal supporting board 2.

The production method of the wired circuit board 1 includes a step (i) (ref: FIG. 23A), in which the metal supporting board 2 is prepared, and then, the insulating base layer 3 is provided on the metal supporting board 2, and a step (2) (ref: FIG. 23B), in which the metal thin film 33 is provided on the metal supporting board 2 exposed from the base opening 60, and the top face of the intermediate insulating layer 5.

The production method of the wired circuit board 1 further includes a step (3) (ref: FIG. 23C), in which the photoresist 25 is provided on the metal thin film 33, and a step (4) (ref: FIG. 24D), in which the photomask 24 is disposed so that the first portion 23 in the photoresist 25 is shielded from light, and the photoresist 25 is exposed to light through the photomask 24.

Furthermore, the production method of the wired circuit board 1 includes a step (5) (ref: FIG. 24E), in which the first portion 23 is removed to expose the metal thin film 33 corresponding to the first portion 23, and a step (6) (ref: FIG. 24F), in which the second conductive pattern 6 is provided on the metal thin film 33 exposed from the photoresist 25.

Furthermore, the production method of the wired circuit board 1 includes a step (iii) (ref: FIG. 24F), in which the photoresist 25 is removed, a step (iv), in which the metal thin film 33 corresponding to the photoresist 25 is removed, and a step (v) (ref: FIG. 22A and FIG. 22B), in which the insulating cover layer 7 is provided on the intermediate insulating layer 5 so as to cover the second conductive pattern 6.

The metal supporting board 2 is made of, for example, a metal material such as stainless steel. The metal supporting board 2 has a thickness of, for example, 10 μm or more, preferably 15 μm or more, and for example, 50 μm or less, preferably 30 μm or less.

[1] As shown in FIG. 24D, in the step (4), the light A applied to the light shield portion 27 of the photomask 24 is shielded with the light shield portion 27, and does not reach the first portion 23 of the photoresist 25.

[2] Meanwhile, the light B applied to the translucent portion 26 of the photomask 24 passes through the translucent portion 26, and reaches the portion other than the first portion 23 in the photoresist 25. Furthermore, in the metal thin film 33 corresponding to the base arc portion 17, the reflected light B' is generated. The reflected light B' is headed downwardly and obliquely toward one side in the width direction.

Figure 26A:
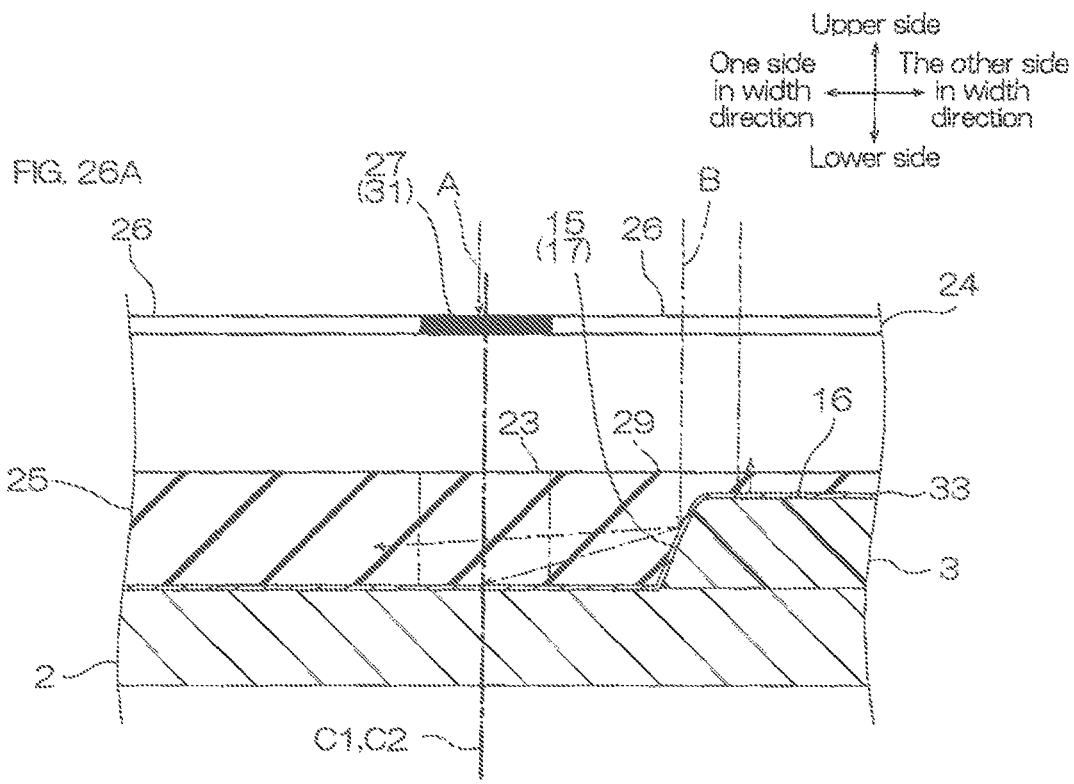
FIG. 26A to FIG. 26C are process diagrams illustrating production of the wired circuit board shown in FIG. 25.
Figure 26B:
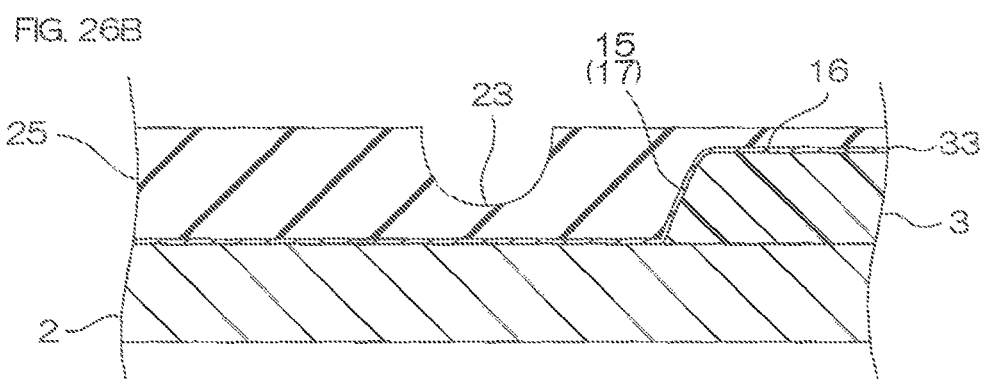
Figure 26C:
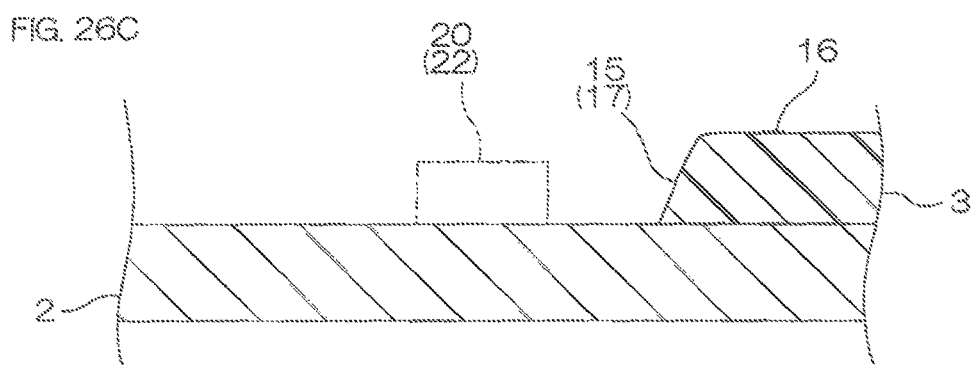

However, even if the wired circuit board 1 in which the ground portion 47 shown by the phantom line in FIG. 25 and FIG. 26C overlaps with the center C2 of the virtual circle VC2 along the base arc portion 17 when viewed from the top is to be produced, as shown in FIG. 26A and FIG. 26B, the step (4) and the step (5) are conducted.

In the wired circuit board 1, the second wire 20 overlaps with the center C2 of the virtual circle along the base arc portion 17 when viewed from the top.

[1] As shown in FIG. 26A, in the step (4), the portion of the light B passes through the translucent portion 26 and reaches the metal thin film 33 corresponding to the base arc portion 17. Then, the light B is reflected at the top face of the metal thin film 33 corresponding to the base arc portion 17, and the reflected light B' is generated. The reflected light B' passes through the photoresist 25 downwardly and obliquely toward one side in the width direction when viewed in cross section, and reaches the first portion 23 of the photoresist 25.

[2] At the same time, as shown in FIG. 25, the reflected light B' is focused, when viewed from the top, from the base arc portion 17 toward the first portion 23 overlapped with the center C2 (center C1 of the virtual circle VC1 along the first arc portion 11) of the virtual circle along the base arc portion 17. That is, when viewed from the top, the metal thin film 33 corresponding to the base arc portion 17 works as a concave lens, and the reflected light B' is focused on the point of the first portion 23, that is, the center C1 of the virtual circle VC1 (center C2 of the virtual circle along the base arc portion 17) along the first arc portion 11. Therefore, the amount of light at the first portion 23 is relatively high. To be specific, the amount of light at the first portion 23 is the amount of light or more that allows the first portion 23 to remain in the step (5) shown in FIG. 22B.

[3] Then, as shown in FIG. 26B, in the step (5), the metal thin film 33 corresponding to the first portion 23 is not allowed to expose, and as shown in FIG. 26C, in the step (6), the deformed second conductive pattern 6 is provided (or the second conductive pattern 6 is not provided at all). That is, light focusing on the first portion 23 of the photoresist 25 of the reflected light B' corresponding to the bent portion 17 causes deformation on the second wire 20.

However, with the method, as shown in FIG. 24D, in the step (4), the light shield portion 27 of the photomask 24 is disposed so as to deviate from the center C1 of the virtual circle VC1 along the first arc portion 11, and therefore, as shown in FIG. 21, even if the reflected light B' reflected at the metal thin film 33 corresponding to the base arc portion 17 is focused on the center C1 of the photoresist 25, light focusing on the first portion 23, where the conductive pattern is to be provided in the photoresist 25, can be avoided (suppressed).

Therefore, as shown in FIG. 24E, in the step (5), the first portion 23 in the photoresist 25 can be removed reliably, and therefore, the metal thin film 33 corresponding to the first portion 23 can be exposed. Therefore, as shown in FIG. 24F, in the step (6), the first conductive pattern 4 having the second wire 20 in which deformation is suppressed can be provided.

As a result, the wired circuit board 1 with excellent connection reliability can be produced.

In the wired circuit board 1, the ground portion 47 can be allowed to be electrically conducted with the metal supporting board 2. Alternatively, the ground portion 47 can be used as a layer that can suppress partial plating at the time of electrolytic plating.

In the eighth embodiment, the first conductive pattern 4 can also be formed by the subtractive method using the positive type photoresist 25.

Ninth Embodiment

In the ninth embodiment, for the members and steps that are the same as the first to eighth embodiments, the same reference numerals are given and detailed descriptions thereof are omitted.

Figure 28:
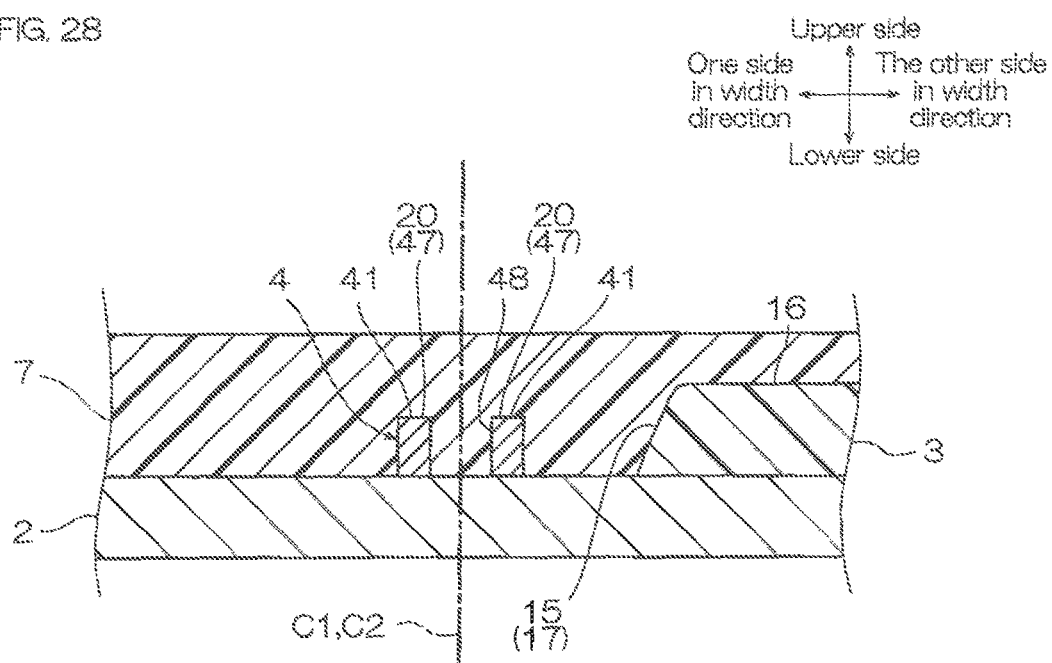
FIG. 28 shows a cross-sectional view along line a-a of the wired circuit board shown in FIG. 27.

As shown in FIG. 27 and FIG. 28, in the ninth embodiment, the ground portion 47 has a conductive opening 48 as an example of the opening in the second wire 20.

The conductive opening 48 penetrates the ground portion 47 (second wire 20) in the thickness direction. The conductive opening 48 has a generally circular shape when viewed from the top. The conductive opening 48 overlaps with the center C2 (center C1 of the virtual circle VC1 along the first arc portion 11) of the virtual circle along the base arc portion 17 when viewed from the top.

The internal diameter (maximum length in opening diameter) of the conductive opening 48 is, for example, 5 μm or more, preferably 10 μm or more, and for example, 50 μm or less, preferably 40 μm or less. The internal diameter (maximum length in the opening diameter) of the conductive opening 48 relative to the width W2 of the second wire 20 is, for example, 5% or more, preferably 10% or more, and for example, 90% or less, preferably 80% or less.

The second wire 20 overlaps with the center C2 (center C1 of the virtual circle VC1 along the first arc portion 11) of the virtual circle along the base arc portion 17 when projected in the front-back direction. The second wire 20 has the width W2 of, for example, 8 μm or more, preferably 10 μm or more, and for example, 200 μm or less, preferably 150 μm or less.

Figure 29A:
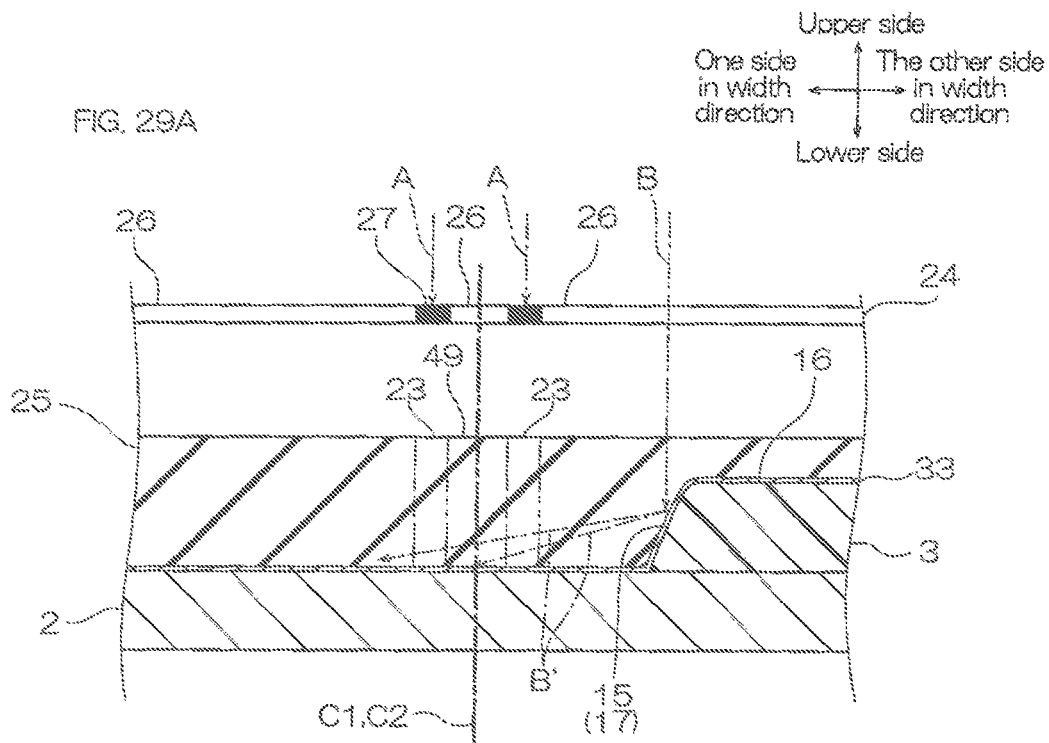
FIG. 29A to FIG. 29C are process diagrams illustrating production of the wired circuit board shown in FIG. 28.

[1] As shown in FIG. 29A, in the step (4) of the production method of the wired circuit board 1, the light A applied to the light shield portion 27 of the photomask 24 is shielded with the light shield portion 27, and does not reach the first portion 23 of the photoresist 25.

[2] Meanwhile, the portion in the photoresist 25 where the conductive opening 48 is to be formed is an opening forming portion 49. The translucent portion 26 is disposed to face the opening forming portion 49. Then, light C applied to the translucent portion 26 passes through the translucent portion 26, and reaches the opening forming portion 49 in the photoresist 25.

[3] Meanwhile, the light B applied to the translucent portion 26 of the photomask 24 passes through the translucent portion 26, reaches the portion other than the first portion 23 in the photoresist 25, and the reflected light B' is generated at the metal thin film 33 corresponding to the base arc portion 17. The reflected light B' is headed downwardly and obliquely toward one side in the width direction. The reflected light B' is focused on the center C2 (center C1 of the virtual circle VC1 along the first arc portion 11) of the virtual circle along the base arc portion 17. However, the center C1 (C2) is included in the opening forming portion 49, and in the above-described [2], the light C reaches the opening forming portion 49, and therefore, as shown in FIG. 23B, in the step (5), it is no hindrance to leaving the opening forming portion 49.

That is, in the step (5), the first portion 23 in the photoresist 25 is removed, and the opening forming portion 49 in the photoresist 25 is left.

Figure 29B:
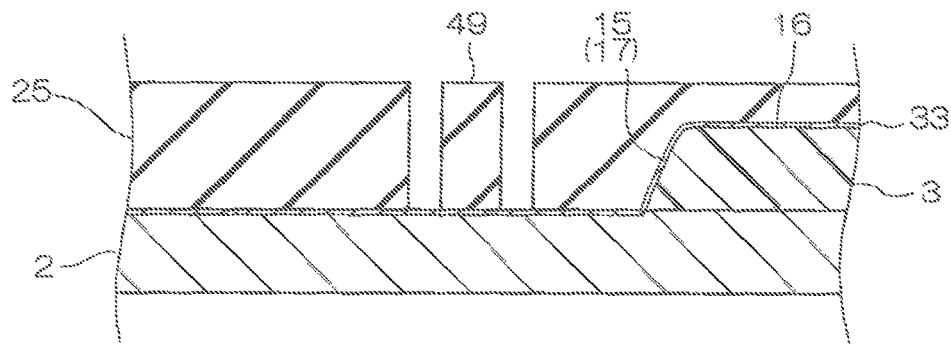
Figure 29C:
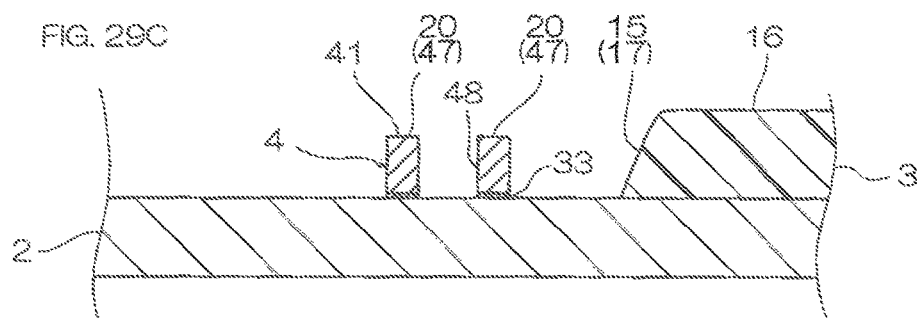

In FIG. 29B, in the step (6), the second wire 20 is formed on the metal thin film 33 corresponding to the first portion 23. Thereafter, the metal thin film 33 corresponding to the photoresist 25 and the photoresist 25 are removed. In this manner, the conductive opening 48 corresponding to the opening forming portion 49 is formed in the second wire 20.

In the ninth embodiment, light focusing on the photomask 24 can be avoided with a simple configuration in which the conductive opening 48 is provided in the second wire 20.

Modified Example of First to Ninth Embodiments

In the first to ninth embodiments, the base arc portion 17 has an arc shape when viewed from the top. However, the base arc portion 17 is not exactly the arc shape when viewed from the top, but may be generally an arc shape when viewed from the top, to be specific, a generally arc shape when viewed from the top that allows the reflected light to be headed to the center C2 of the virtual circle VC2 along the base arc portion 17 will suffice.

The above-described first to ninth embodiments can be suitably combined.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A wired circuit board comprising an insulating layer having an inclination face when viewed in a cross-sectional view of the wired circuit board, and a conductive pattern disposed on an upper face including the inclination face of the insulating layer, wherein the inclination face has a generally arc shape of a circle in a plan view of the wired circuit board, the entire conductive pattern deviates from the center of the circle along the arc, the conductive pattern has an inner circle portion that is disposed in at least the circle, the insulating layer has a first flat face continued to the lower end of the inclination face, and the inner circle portion is disposed at the first flat face.

2. The wired circuit board according to claim 1, wherein the conductive pattern is partially cut out to form a cutout, and the cutout overlaps with the center when viewed from the top.

3. The wired circuit board according to claim 1, wherein the outer shape of the conductive pattern includes the center when viewed from the top, and the conductive pattern has an opening including the center.

4. The wired circuit board according to claim 1, wherein the conductive pattern is provided above and below the insulating layer.

5. The wired circuit board according to claim 1, further comprising:

a metal supporting board provided under the conductive pattern.

* * * * *